United States Patent
Rice et al.

(10) Patent No.: US 7,168,553 B2
(45) Date of Patent: Jan. 30, 2007

(54) DYNAMICALLY BALANCED SUBSTRATE CARRIER HANDLER

(75) Inventors: Michael R. Rice, Pleasanton, CA (US); Eric A. Englhardt, Palo Alto, CA (US); Robert B. Lowrance, Los Gatos, CA (US); Martin R. Elliott, Round Rock, TX (US); Jeffrey C. Hudgens, San Francisco, CA (US)

(73) Assignee: Applied Materials, Inc., Santa Clara, CA (US)

( * ) Notice: Subject to any disclaimer, the term of this patent is extended or adjusted under 35 U.S.C. 154(b) by 257 days.

(21) Appl. No.: 10/988,190

(22) Filed: Nov. 12, 2004

(65) Prior Publication Data

US 2005/0224315 A1 Oct. 13, 2005

Related U.S. Application Data

(60) Provisional application No. 60/520,041, filed on Nov. 13, 2003.

(51) Int. Cl.
*B65G 29/00* (2006.01)

(52) U.S. Cl. .............................. 198/468.9; 198/468.01; 198/468.6

(58) Field of Classification Search .............. 198/463.1, 198/463.3, 468.01, 468.6, 468.8, 468.9; 414/749.1, 751.1; 901/7, 8, 40; 73/504.12, 73/504.15, 514.32
See application file for complete search history.

(56) References Cited

U.S. PATENT DOCUMENTS

| | | | |
|---|---|---|---|
| 4,566,118 A | 1/1986 | Chaplin et al. | |
| 4,699,006 A | 10/1987 | Boxenhorn | |
| 4,714,600 A * | 12/1987 | Driscoll et al. | 423/319 |
| 4,811,522 A | 3/1989 | Gill, Jr. | |
| 5,170,433 A | 12/1992 | Elliott et al. | |

(Continued)

FOREIGN PATENT DOCUMENTS

EP 0 766 288 A3 4/1997

(Continued)

OTHER PUBLICATIONS

Weiss, Mitchell, "Evaluating 300-mm Fab Automation Technology Options and Selection Criteria", Jun. 1997, MICRO, vol. 15, No. 6, pp. 65-66, 68, 70, 72, 74, 76, 78-79.

(Continued)

*Primary Examiner*—James R. Bidwell
(74) *Attorney, Agent, or Firm*—Dugan & Dugan

(57) ABSTRACT

In a first aspect, a substrate loading station is served by a conveyor which continuously transports substrate carriers. A substrate carrier handler that is part of the substrate loading station operates to exchange substrate carriers with the conveyor while the conveyor is in motion. A carrier exchange procedure may include moving an end effector of the substrate carrier handler at a velocity that substantially matches a velocity of the conveyor. A balancing mass is coupled directly or indirectly to a frame on which the substrate carrier handler is mounted and is adapted to accelerate in a direction opposite to the direction of end effector acceleration, as the end effector accelerates. Thus, inertial loads may be substantially balanced, and frame vibration reduced, despite potentially high rates of acceleration. Numerous other aspects are provided.

43 Claims, 27 Drawing Sheets

U.S. PATENT DOCUMENTS

| | | | |
|---|---|---|---|
| 5,233,540 A | | 8/1993 | Andersson et al. |
| 5,710,720 A | | 1/1998 | Algrain et al. |
| 5,844,664 A | | 12/1998 | Van Kimmenade et al. |
| 5,895,192 A | * | 4/1999 | Parnell et al. ........... 198/468.9 |
| 6,144,118 A | | 11/2000 | Cahill et al. |
| 6,256,869 B1 | * | 7/2001 | Asai et al. ............... 198/468.9 |
| 6,382,400 B1 | * | 5/2002 | Hofele et al. .......... 198/468.01 |
| 2002/0093637 A1 | | 7/2002 | Yuan et al. |
| 2002/0104950 A1 | | 8/2002 | Mayama |

FOREIGN PATENT DOCUMENTS

| | | |
|---|---|---|
| JP | 61107211 A | 5/1986 |
| JP | 03263810 A | 11/1991 |
| JP | 08326835 A | 12/1996 |
| JP | 10077940 A | 3/1998 |
| JP | 11224644 A | 8/1999 |
| JP | 2000068350 | 3/2000 |
| JP | 2001308112 A | 11/2001 |
| WO | WO 96/38766 | 12/1996 |

OTHER PUBLICATIONS

No-Author, "Equipe Helps Streamline 300 mm Wafer Processing", Dec. 1, 1997, Manufacturing Automation, vol. 7, No. 3, p. 1-5.

No-Author, "PRI Selected By Varian Semiconductor to Supply 300mm Integrated Front-End Buffering Solutions", Feb. 10, 2000, Newswire, p. 7434.

No-Author, "300mm Single-Wafer Handling" (Brief Article), Apr. 1, 2000, Solid State Technology, vol. 43, No. 4, p. 99.

* cited by examiner

DYNAMICALLY BALANCED SUBSTRATE CARRIER HANDLER

The present application claims priority from U.S. Provisional Patent Application Ser. No. 60/520,041, filed Nov. 13, 2003 and titled "Dynamically Balanced Substrate Carrier Handler", which is hereby incorporated by reference herein in its entirety.

CROSS REFERENCE TO RELATED APPLICATIONS

The present application is related to the following commonly-assigned, co-pending U.S. patent applications, each of which is hereby incorporated herein by reference in its entirety for all purposes:

U.S. patent application Ser. No. 10/650,310, filed Aug. 28, 2003 and titled "System For Transporting Substrate Carriers";

U.S. patent application Ser. No. 10/650,312, filed Aug. 28, 2003 and titled "Method and Apparatus for Using Substrate Carrier Movement to Actuate Substrate Carrier Door Opening/Closing";

U.S. patent application Ser. No. 10/650,481, filed Aug. 28, 2003 and titled "Method and Apparatus for Unloading Substrate Carriers from Substrate Carrier Transport Systems";

U.S. patent application Ser. No. 10/650,479, filed Aug. 28, 2003 and titled "Method and Apparatus for Supplying Substrates to a Processing Tool";

U.S. Provisional Patent Application No. 60/407,452, filed Aug. 31, 2002 and titled "End Effector Having Mechanism For Reorienting A Wafer Carrier Between Vertical And Horizontal Orientations";

U.S. Provisional Patent Application No. 60/407,337, filed Aug. 31, 2002, and titled "Wafer Loading Station with Docking Grippers at Docking Stations";

U.S. patent application Ser. No. 10/650,311, filed Aug. 28, 2003 and titled "Substrate Carrier having Door Latching and Substrate Clamping Mechanism";

U.S. patent application Ser. No. 10/764,982, filed Jan. 26, 2004 and titled "Methods and Apparatus for Transporting Substrate Carriers";

U.S. patent application Ser. No. 10/650,480, filed Aug. 28, 2003 and titled "Substrate Carrier Handler That Unloads Substrate Carriers Directly From a Moving Conveyor";

U.S. patent application Ser. No. 10/764,820, filed Jan. 26, 2004, and titled "Overhead Transfer Flange and Support for Suspending Substrate Carrier";

U.S. Provisional Patent Application No. 60/443,115, filed Jan. 27, 2003, and titled "Apparatus and Method for Storing and Loading Wafer Carriers";

U.S. Provisional Patent Application No. 60/520,180, filed Nov. 13, 2003, and titled "Calibration of High Speed Loader to Substrate Transport System"; and U.S. Provisional Patent Application No. 60/520,035, filed Nov. 13, 2003, and titled "Apparatus and Method for Transporting Substrate Carriers Between Conveyors".

FIELD OF THE INVENTION

The present invention relates generally to semiconductor device fabrication systems, and is more particularly concerned with transportation of substrate carriers within a fabrication facility.

BACKGROUND OF THE INVENTION

Manufacturing of semiconductor devices typically involves performing a sequence of procedures with respect to a substrate such as a silicon substrate, a glass plate, a mask, a reticule, etc. These steps may include polishing, deposition, etching, photolithography, heat treatment, and so forth. Usually a number of different processing steps may be performed in a single processing system or "tool" which includes a plurality of processing chambers. However, it is generally the case that other processes are required to be performed at other processing locations within a fabrication facility, and it is accordingly necessary that substrates be transported within the fabrication facility from one processing location to another. Depending upon the type of semiconductor device to be manufactured, there may be a relatively large number of processing steps required to be performed at many different processing locations within the fabrication facility.

It is conventional to transport substrates from one processing location to another within substrate carriers such as sealed pods, cassettes, containers and so forth. It is also conventional to employ automated substrate carrier transport devices, such as automatic guided vehicles, overhead transport systems, substrate carrier handling robots, etc., to move substrate carriers from location to location within the fabrication facility or to transfer substrate carriers from or to a substrate carrier transport device.

For an individual substrate, the total fabrication process, from formation or receipt of the virgin substrate to cutting of semiconductor devices from the finished substrate, may require an elapsed time that is measured in weeks or months. Accordingly, it would be desirable to speed transferring and/or processing times whenever possible.

SUMMARY OF THE INVENTION

In a first aspect of the invention, a first apparatus is provided that includes a frame and a substrate carrier handler coupled to the frame. The substrate carrier handler includes an end effector adapted to move a substrate carrier to or from a conveyor adapted to transport substrate carriers. The substrate carrier handler is further adapted to accelerate while moving the substrate carrier to or from the conveyor. The acceleration of the substrate carrier imposes a first inertial load on the frame. The first apparatus also includes a moveable balancing mass coupled to the frame and adapted to accelerate when the end effector accelerates so as to substantially cancel the first inertial load and thereby reduce a vibration that would occur absent the balancing mass.

In a second aspect of the invention, a substrate transport system includes a conveyor adapted to transport a substrate carrier in a substantially horizontal direction, and an apparatus adjacent the conveyor. The apparatus adjacent the conveyor includes a frame and a substrate carrier handler coupled to the frame. The substrate carrier handler includes an end effector adapted to move a substrate carrier to or from a conveyor adapted to transport substrate carriers. The substrate carrier handler is adapted to accelerate while moving the substrate carrier to or from the conveyor. The acceleration of the substrate carrier handler imposes a first inertial load on the frame. The substrate transport system also includes a moveable balancing mass coupled to the frame and adapted to accelerate when the end effector accelerates so as to substantially cancel the first inertial load and thereby reducing a vibration that would occur absent the balancing mass.

In a third aspect of the invention, a substrate carrier handler is provided that includes (1) a horizontal guide; and (2) an end effector mounted for horizontal movement along the horizontal guide, adapted to accelerate along the horizontal guide while moving a substrate carrier, and by said acceleration to impose a first inertial load on the horizontal guide. The substrate carrier handler also includes a moveable balancing mass coupled to the horizontal guide and adapted to accelerate when the end effector accelerates so as to substantially cancel the first inertial load, thereby reducing a vibration that would occur absent the balancing mass. Numerous other aspects are provided.

Other features and aspects of the present invention will become more fully apparent from the following detailed description of exemplary embodiments, the appended claims and the accompanying drawings.

DETAILED DESCRIPTION

Figure 1:
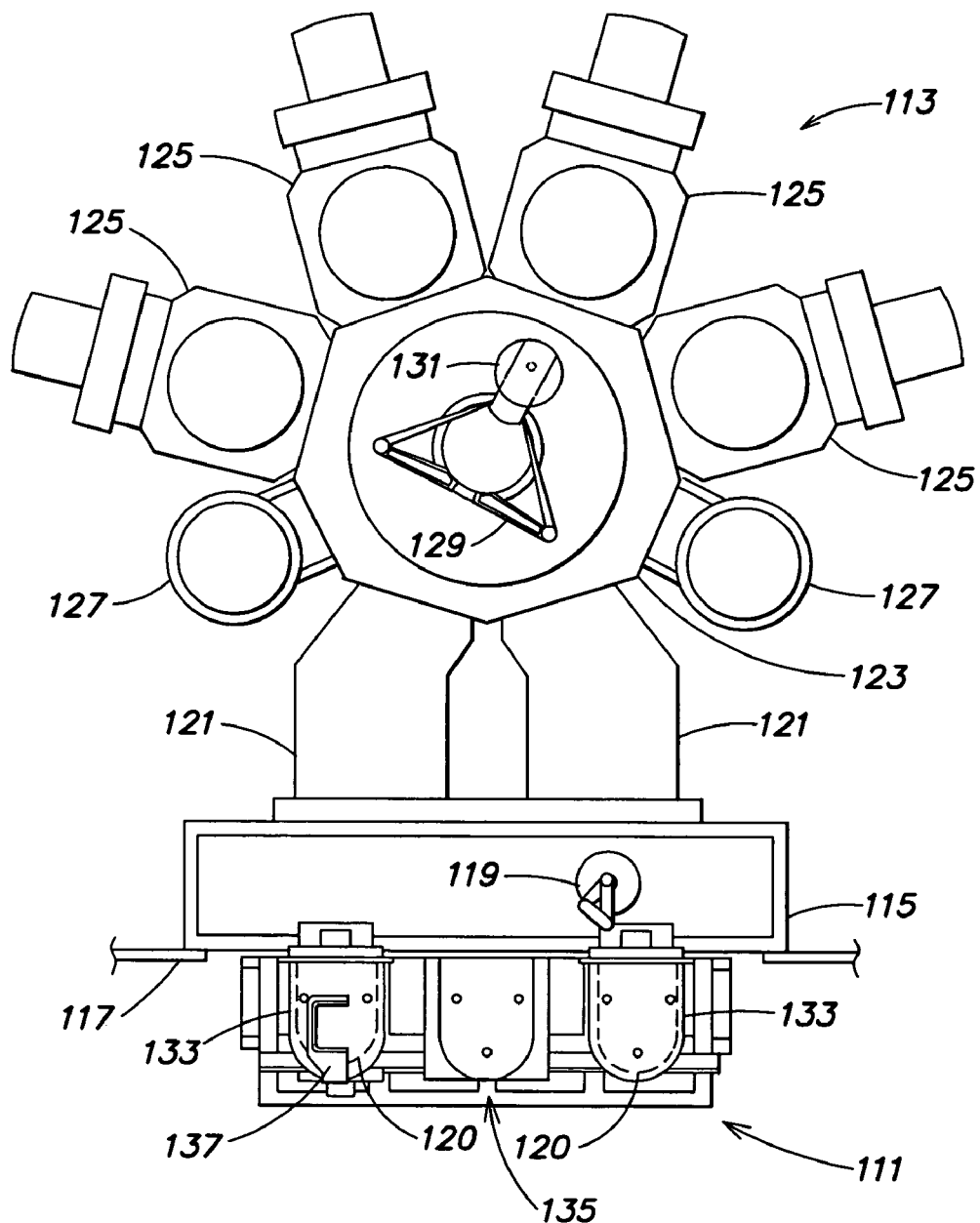
FIG. 1 is a top plan view of a conventional arrangement of a processing tool and an associated substrate carrier loading and storage apparatus.

Previously incorporated U.S. patent application Ser. No. 10/650,310, filed Aug. 28, 2003, entitled "SYSTEM FOR TRANSPORTING SEMICONDUCTOR SUBSTRATE CARRIERS", discloses a substrate carrier transport system that includes a conveyor for substrate carriers that is intended to be constantly in motion during operation of the fabrication facility which it serves. Accordingly substrates or substrate carriers are loaded and unloaded to and from the conveyor while the conveyor is in motion.

The invention presented in U.S. patent application Ser. No. 10/650,310, filed Aug. 28, 2003, provides a substrate carrier handler that, in one aspect, is part of a load stations. The substrate carrier handler is adapted to remove substrate carriers from a moving conveyor for subsequent presentation of the substrate carriers to the loadport of a processing tool. The substrate carrier handler of the load stations will generally also transfer substrate carriers from the loadport back onto the conveyor. The substrate carrier handler may comprise an end effector attached to a carriage of a linear actuator. To the extent that mass comprising at least the end effector, the carriage, and any hardware that connects the end effector to the carriage, accelerates with respect to the frame of the load stations, the frame will tend to be exposed to inertial forces arising from that accelerating mass. The mass of substrate carriers being accelerated relative to the frame of the load stations may also be a significant source of such inertial forces. These inertial forces are addressed by the present invention, which is described below with reference to FIGS. 8–14.

In accordance with at least one aspect of the invention, a substrate carrier handler at a substrate loading station includes a horizontal guide that is moveable vertically along parallel vertical guides, and an end effector that is moveable horizontally along the horizontal guide. To unload a substrate carrier from a moving conveyor that transfers substrate carriers (a "substrate carrier conveyor") and that passes by the substrate loading station, the end effector is moved along the horizontal guide at a velocity that substantially matches the velocity of the substrate carrier (e.g., by substantially matching substrate carrier speed in a horizontal direction). In addition, the end effector may be maintained in a position adjacent the substrate carrier. The end effector thus may substantially match a position of the substrate carrier while substantially matching a velocity of the substrate carrier. Likewise for loading operations, conveyor position (e.g., for substrate of substrate carrier placement) and/or velocity may be substantially matched.

While the end effector substantially matches the substrate carrier's velocity (and/or position), the end effector is raised, by moving the horizontal guide upwardly along the vertical guides, so that the end effector contacts the substrate carrier and disengages the substrate carrier from the substrate carrier conveyor. A substrate carrier similarly may be loaded onto the moving substrate carrier conveyor by substantially matching end effector and conveyor velocities (and/or positions) during loading.

FIG. 1 is a top plan view showing a conventional loading and storing apparatus 111 in position for storing substrate carriers adjacent a conventional processing tool 113. A factory interface (FI) 115 is shown positioned between the loading and storage apparatus 111 and the processing tool 113. The loading and storage apparatus 111 is positioned adjacent a first side of a clean room wall 117 and the factory interface 115 is positioned adjacent a second side of the clean room wall 117. The factory interface 115 includes an FI robot 119 that may move horizontally along a track (not shown) that is parallel to the clean room wall 117 and may extract a substrate (not shown) from one or more substrate carriers 120 present at the loading and storage apparatus 111. The FI robot 119 may transport the substrate to a load lock chamber 121 of the processing tool 113.

The load lock chambers 121 shown in FIG. 1 are coupled to a transfer chamber 123 of the processing tool 113. Also coupled to the transfer chamber 123 are processing chambers 125 and auxiliary processing chambers 127. Each of the processing chambers 125 and auxiliary processing chambers 127 may be arranged to perform a conventional semiconductor device fabrication process such as oxidation, thin film deposition, etching, heat treatment, degassing, cool down, etc. A substrate handling robot 129 is disposed within the transfer chamber 123 to transfer substrates, such as substrate 131, among the processing chambers 125, 127 and the load lock chambers 121.

The loading and storage apparatus 111 includes one or more substrate carrier storage shelves 133 for storing substrate carriers before or after the substrates contained in the substrate carriers are processed by the processing tool 113. The loading and storage apparatus 111 also includes one or more docking stations (which are not shown but may be, for example, below the storage shelves 133). A substrate carrier may be docked at a docking station for extraction of substrates therefrom by the FI robot 119. Also included in the loading and storage apparatus 111 is a factory load location 135, at which a substrate carrier transport device, such as an automatic guided vehicle (AGV), may deposit or pick up a substrate carrier.

The loading and storage apparatus 111 further includes a substrate carrier handler 137 which is adapted to move substrate carriers among the factory load location 135, the storage shelves 133 and the docking stations.

In line with the above-noted goal of facilitating transport of substrates within a fabrication facility, it may be desirable to transport substrate carriers to and from a substrate loading station such as the loading and storage apparatus 111 by means of a substrate carrier conveyor that is constantly in motion (e.g., to reduce dwell time and thus work in progress and manufacturing costs). Consequently, an inventive substrate loading station is provided that can unload substrate carriers from a substrate carrier conveyor, and that can load substrate carriers onto the substrate carrier conveyor, while the substrate carrier conveyor is moving.

Figure 2:
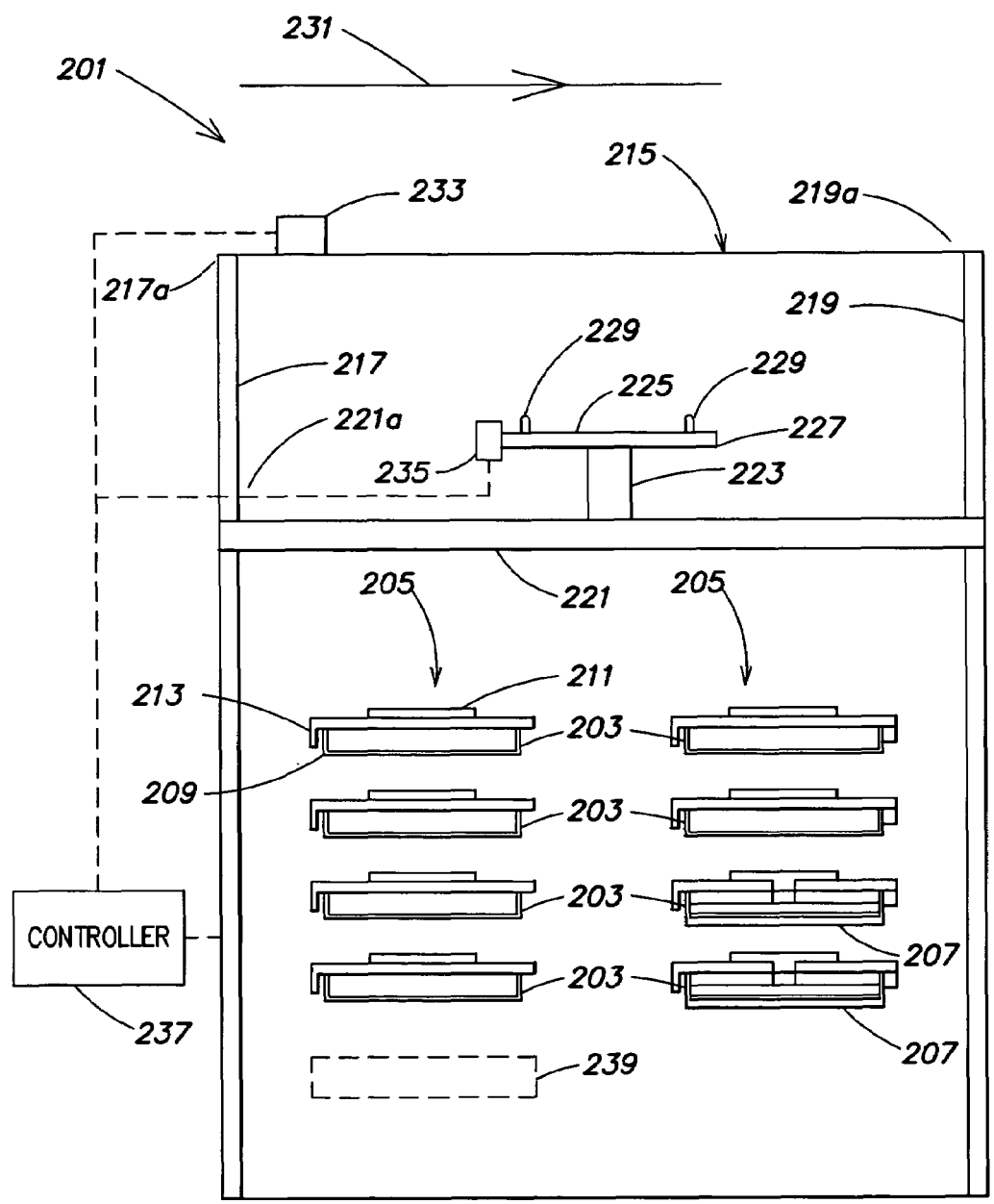
FIG. 2 is a front elevational view of a substrate loading station provided in accordance with the present invention.

An embodiment of the invention will now be described with reference to FIGS. 2–6E. FIG. 2 is a front elevational view of a substrate loading station 201 provided in accordance with the invention. Although not shown in FIG. 2, it should be understood that the inventive substrate loading station 201 may be associated with a processing tool and factory interface of the kind described in connection with FIG. 1.

The substrate loading station 201 includes a plurality of docking stations 203. In the particular embodiment shown in FIG. 2, the substrate loading station 201 includes a total of eight docking stations 203, arranged in two columns 205 of four docking stations each. Other numbers of columns and/or docking stations may be employed. Each docking station 203 is adapted to support and/or dock a substrate carrier 207 at the docking station 203 and to allow a substrate (not shown) to be extracted from the substrate carrier 207 at the docking station 203 and transferred to a processing tool such as the processing tool 113 of FIG. 1 (e.g., by a factory interface robot, such as the factory interface robot 119 of FIG. 1). In one embodiment of the invention, the substrate carriers 207 are single substrate carriers. "Single substrate carrier" will be understood to mean a substrate carrier shaped and sized to contain only one substrate at a time. Each docking station 203 may be configured, for example, as described in previously incorporated U.S. patent application Ser. No. 60/407,337, filed Aug. 31, 2002 and titled "SEMICONDUCTOR SUBSTRATE LOADING STATION WITH DOCKING GRIPPERS AT DOCKING STATIONS. Other docking station configurations may be employed.

Each docking station 203 includes a port 209 through which a substrate may be transferred to the factory interface (e.g., factory interface 115 in FIG. 1). Adjacent each port 209 is a docking gripper 211 which is adapted to suspend a substrate carrier 207 and to move the suspended substrate carrier between a docked and undocked position. A moveable stage or other support (not shown) alternatively may be employed to support (e.g., from below or otherwise) and/or dock/undock each substrate carrier 207 at each docking station 203. Also associated with each port 209 is a substrate carrier opener 213 which, in one aspect, is adapted to employ docking movement of a substrate carrier 207 to open the substrate carrier 207 as it moves from an undocked position to a docked position as described in previously incorporated U.S. patent application Ser. No. 10/650,312, filed Aug. 28, 2003, entitled "METHOD AND APPARATUS FOR USING SUBSTRATE CARRIER MOVEMENT TO ACTUATE SUBSTRATE CARRIER DOOR OPENING/CLOSING". Each substrate carrier 207 may have, for example, features disclosed in previously incorporated U.S. patent application Ser. No. 10/650,311, filed Aug. 28, 2003, entitled "SUBSTRATE CARRIER HAVING DOOR LATCHING AND SUBSTRATE CLAMPING MECHANISMS".

The substrate loading station 201 also includes a substrate carrier handler 215 which operates in accordance with an aspect of the invention. The substrate carrier handler 215 includes a pair of vertical guides 217, 219 and a horizontal guide 221 which is mounted for vertical movement on the vertical guides 217, 219. A belt drive or a lead screw and an associated motor or motors (which are not shown) or other suitable mechanism is provided to drive the horizontal guide 221 for vertical movement along the vertical guides 217, 219. A support 223 is mounted on the horizontal guide 221 for horizontal movement along the horizontal guide 221. A belt drive or lead screw, and associated motor or motors (which are not shown) or other suitable mechanism is provided to move the support 223 horizontally along the horizontal guide 221.

In at least one embodiment of the invention, the vertical guides 217, 219 may each comprise an integrated guide/ driving mechanism such as Part No. 1140-260-10, 1768 mm available from Rexroth-Bosch Group. Likewise, the horizontal guide 221 may comprise an integrated guide/driving mechanism such as Part No. 1140-260-10, 1468 mm also available from Rexroth-Bosch Group. Other guide/driving mechanism systems may be employed.

An end effector 225 is mounted on the support 223. The end effector 225 may be, for example, in the form of a horizontally-oriented platform 227 adapted to support a substrate carrier (e.g., one of the substrate carriers 207). In at least one embodiment, the platform 227 may have kinematic pins or other kinematic positioning features 229. (Although only two kinematic pins 229 are shown in FIG. 2, other numbers of kinematic pins such as three or more may be provided on the platform 227.) The kinematic pins 229 may cooperate with concave or otherwise shaped features (not shown in FIG. 2) on the bottom of the substrate carrier 207 to guide the substrate carrier 207 into correct (positive) positioning on the platform 227. In at least one embodiment of the invention, the end effector 225 may comprise, for example, an end effector capable of changing the orientation of a substrate carrier from vertical to horizontal and vice versa as described in previously incorporated U.S. patent application Ser. No. 60/407,452, filed Aug. 31, 2002 and titled "END EFFECTOR HAVING MECHANISM FOR REORIENTING A SUBSTRATE CARRIER BETWEEN VERTICAL AND HORIZONTAL ORIENTATIONS" (Attorney Docket No. 7097). Any other suitable end effector also may be employed.

A continuously moving conveyor, schematically represented by an arrow 231, is positioned above the substrate loading station 201 and the substrate carrier handler 215. The conveyor 231 is adapted to transport substrate carriers such as the substrate carriers 207 to and from the substrate loading station 201. The substrate loading station 201 may include sensors 233, 235 for detecting movement and/or positions of (1) the conveyor; (2) components of the conveyor 231 (e.g., components used to support substrate carriers being transported by the conveyor 231 as described further below with reference to FIGS. 4A–4E, 6A–6E and 7C–7D); and/or (3) substrate carriers being transported by the conveyor 231. For example, the sensor 233 may be mounted on the substrate loading station 201, and the sensor 235 may be mounted on the end effector 225. Other sensor locations may be employed, as may any suitable sensors (e.g., through beam sensors, reflection-based sensors, etc.).

In at least one embodiment of the invention, the sensor 233 comprises a first sensor pair (not separately shown) for detecting a speed of the conveyor 231 (and/or the speed with which a substrate carrier 207 is being transported by the conveyor 231), and a second sensor pair (not separately shown) for detecting whether a substrate carrier 207 is being transported by the conveyor 231. For example, the first sensor pair may be mounted at an elevation of the conveyor 231 and the second sensor pair may be mounted at an elevation at which substrate carriers are transported by the conveyor 231. Each sensor pair may comprise, for example, a Model No. M126E2LDQ light source and a Model No. Q23SN6RMHSQDP receiver available from Banner Engineering Corp. Other sensor arrangements/types may be employed.

A controller 237 may be coupled to the sensors 233, 235 and to the substrate carrier handler 215 to receive input from the sensors 233, 235 and to control operation of the substrate carrier handler 215 as described further below. More or fewer than the two sensors 233, 235 may be provided, and the sensors 233, 235 may be mounted at locations other than those shown in FIG. 2. The controller 237 may be the same controller used to control operation of a processing tool that the substrate loading station 201 serves, or a separate controller.

Figure 3:
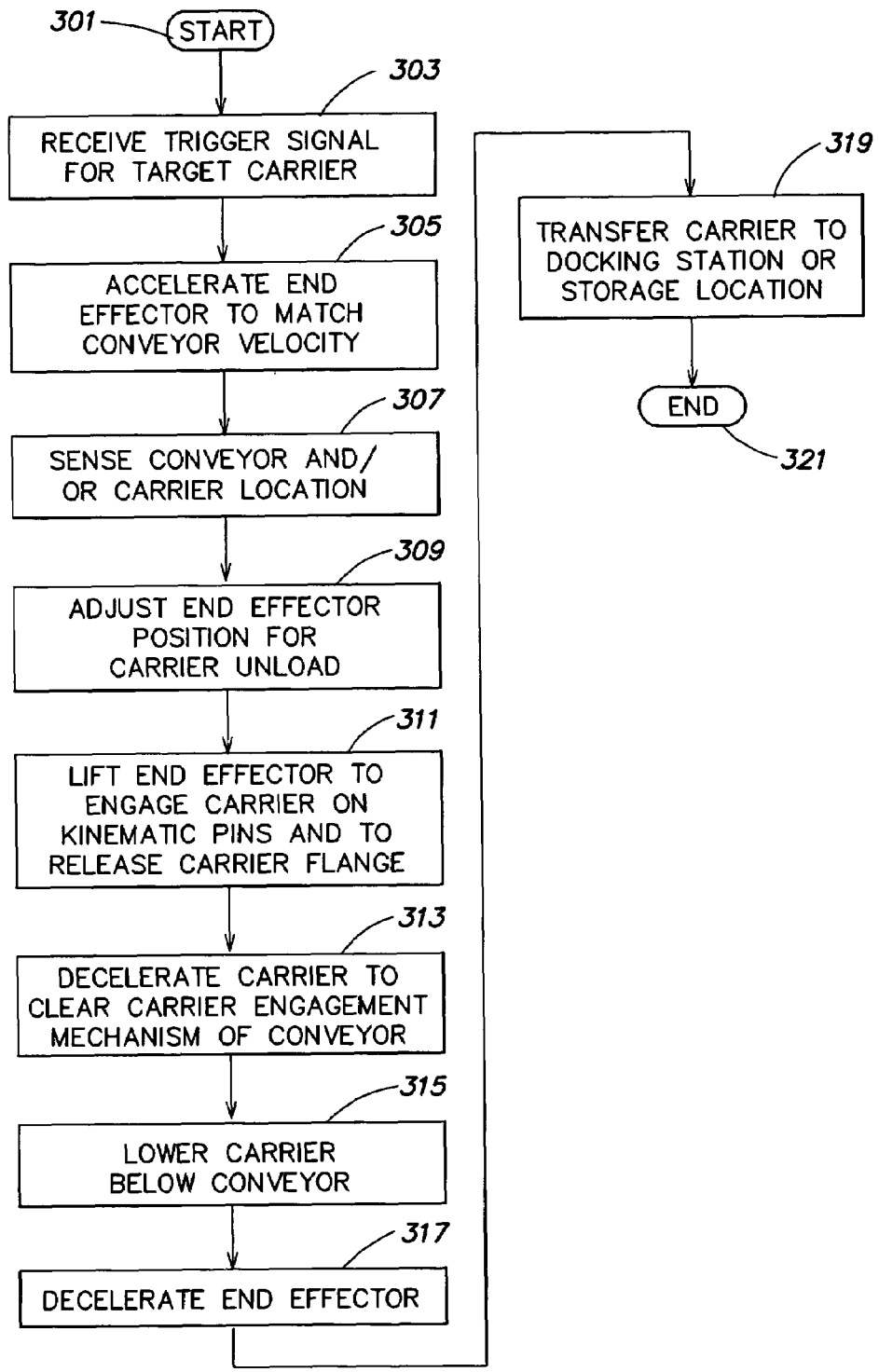
FIG. 3 is a flow chart that illustrates an exemplary process performed in accordance with the invention to unload a substrate carrier from a moving conveyor.

FIG. 3 is a flow chart that illustrates an exemplary process that may be performed by the substrate loading station 201 in accordance with the invention to unload a substrate carrier 207 from the conveyor 231. FIGS. 4A–4E are schematic side views, illustrating stages of the process of FIG. 3.

When an operation for unloading a substrate carrier 207 from the conveyor 231 is to be performed, the horizontal guide 221 of the substrate carrier handler 215 is positioned near the upper ends 217a, 219a of the vertical guides 217, 219, and the support 223 is positioned near the upstream side 221a (in the view of FIG. 2, the left side) of the horizontal guide 221.

Figure 4A:
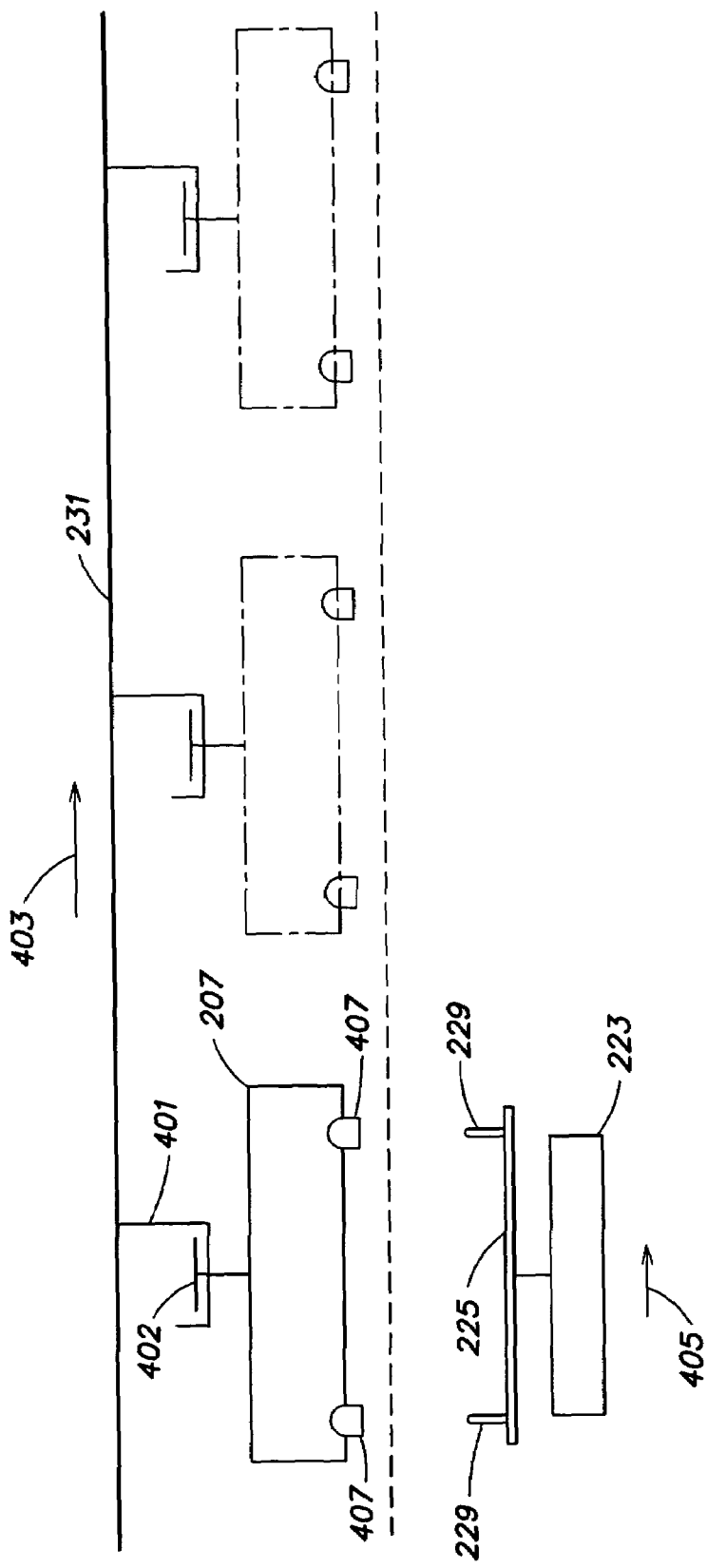
FIGS. 4A–4E are schematic side views showing various stages of the process of FIG. 3.

The process of FIG. 3 starts at step 301 and proceeds to step 303. At step 303 the controller 237 receives a signal (e.g., from the sensor 233 or 235) to indicate the presence of a substrate carrier 207 that is being transported by the conveyor 231 and that is to be unloaded from the conveyor 231 by the substrate loading station 201 (a "target substrate carrier 207"). Upon receipt of the sensor signal, the controller 237 controls the substrate carrier handler 215 such that the support 223 (with the end effector 225 attached thereto) is accelerated in the same direction of travel as the conveyor 231 (e.g., to the right in FIG. 2) to substantially match the position and speed of the target substrate carrier 207 (step 305, FIG. 3). FIG. 4A illustrates this stage of the process of FIG. 3.

In at least one embodiment of the invention, prior to accelerating the end effector 225 so that it substantially matches the position and speed of the target substrate carrier 207 (step 305), the controller 237 employs the sensor 233 to determine a speed of the conveyor 231. Position of the conveyor 231 also may be determined. As stated, the sensor 233 may comprise a first sensor pair (not separately shown) for detecting a speed of the conveyor 231 (and/or the speed with which a substrate carrier 207 is being transported by the conveyor 231), and a second sensor pair (not separately shown) for detecting whether a substrate carrier 207 is being transported by the conveyor 231.

Based on the speed of the conveyor 231, the controller 237 may determine a motion profile for the end effector 225 and direct motion of the end effector 225 in accordance with the motion profile to substantially match the speed and position of the end effector 225 and target substrate carrier 207. The motion profile may be "predetermined", such that the controller 237 only allows the end effector 225 to begin performing an unload operation (e.g., begin accelerating) if the speed of the conveyor 231 is within a predetermined speed range (e.g., a range that ensures that the end effector 225 will be properly aligned with the target substrate carrier 207 if the end effector 225 is accelerated in accordance with the predetermined motion profile); otherwise, the process of FIG. 3 ends.

Alternatively, the controller 237 may employ the speed of the conveyor 231 to determine a motion profile for the end effector 225 (e.g., using a look up table of predetermined motion profiles, using an algorithm to calculate the motion profile, etc.). It will be understood that substrate carrier speed, rather than conveyor speed may be measured and employed to determine a motion profile or whether to employ a predetermined motion profile for the end effector 225. Each motion profile may include all of the accelerations, decelerations, raisings and lowerings (described below) employed by the end effector 225 during an unload operation.

In FIG. 4A the target substrate carrier 207 is shown being transported by the conveyor 231 by means of a carrier engagement member 401 which engages a top flange 402 of the substrate carrier 207. Other configurations for supporting the substrate carrier 207 may be employed (e.g., one or more mechanisms for supporting the substrate carrier 207 by its sides, bottom or the like). An arrow 403 indicates the direction of motion of the conveyor 231. The end effector 225 of the substrate carrier handler 215 is illustrated in FIG. 4A in a position below the target substrate carrier 207 and being moved (as indicated by an arrow 405) in the same direction as the conveyor 231 at a speed that substantially matches the speed of the target substrate carrier 207. The end effector 225 thereby substantially matches a velocity (e.g., speed and direction) of the target substrate carrier 207. In addition, the end effector 225 substantially matches a position of the target substrate carrier 207. More generally, the end effector 225 substantially matches a motion (velocity and/or position) of the target substrate carrier 207. As used herein, "substantially matches" means sufficiently matches so that a substrate carrier may be unloaded from and/or loaded onto a moving conveyor and/or carrier engagement member without damaging a substrate contained within the substrate carrier or generating potentially damaging particles.

In the embodiment shown in FIG. 4A, the target substrate carrier 207 moves with the conveyor 231. Accordingly, the end effector 225 also substantially matches the speed, velocity, motion and/or position of the conveyor 231. There may be embodiments in which the conveyor 231 moves at a different rate, or not at all, relative to the target substrate carrier 207. For example, the carrier engagement member 401 itself may move the target substrate carrier 207 along the conveyor 231. In this later embodiment, the end effector 225 may not substantially match the speed, velocity and/or position of the conveyor 231.

Referring again to FIG. 3, at step 307, the position of the target substrate carrier 207 relative to the end effector 225 is detected (e.g., via a signal or signals from the sensor 235 (FIG. 2)). For example, if the sensor 235 comprises a light source/detector pair, such as a Model No. QS30 sensor system available from Banner Engineering Corp. or the like, the sensor 235 may emit a beam of light toward the target substrate carrier 207 that is only detected by the sensor 235 if the end effector 225 is properly positioned relative to the target substrate carrier 207 (e.g., by providing the substrate carrier 207 with an appropriate reflective surface and/or surface topography such as an angled notch that reflects light toward the sensor 235 only when the end effector 225 is properly positioned relative to the substrate carrier 207).

In at least one embodiment of the invention, if the end effector 225 is not properly positioned relative to the target substrate carrier 207, then the process of FIG. 3 ends. Alternatively, in another embodiment of the invention, any necessary adjustments in the position of the end effector 225 relative to the target substrate carrier 207 may be made (step 309). For example, the controller 237 may accelerate and/or decelerate the end effector 225 until a proper alignment signal is received from the sensor 235 so as to ensure that kinematic pins 229 are properly positioned below alignment features (e.g., concave features 407) of the target substrate carrier 207. It will be appreciated that the steps 307 and 309 are performed while the target substrate carrier 207 and the end effector 225 are in motion, and are performed so that the end effector 225 is positioned below the target substrate carrier 207 while substantially matching speed therewith. Accordingly, the end effector 225 is moved so as to remain adjacent and below the target substrate carrier 207 while the target substrate carrier 207 is in motion. It will be understood that the relative position of the target substrate carrier 207 and the end effector 225 may be detected and adjusted numerous times (or continuously), and that a feedback control loop (not shown) may be employed to ensure that the speed and/or position of the end effector 225 remain substantially matched with that of the target substrate carrier 207.

Figure 4B:
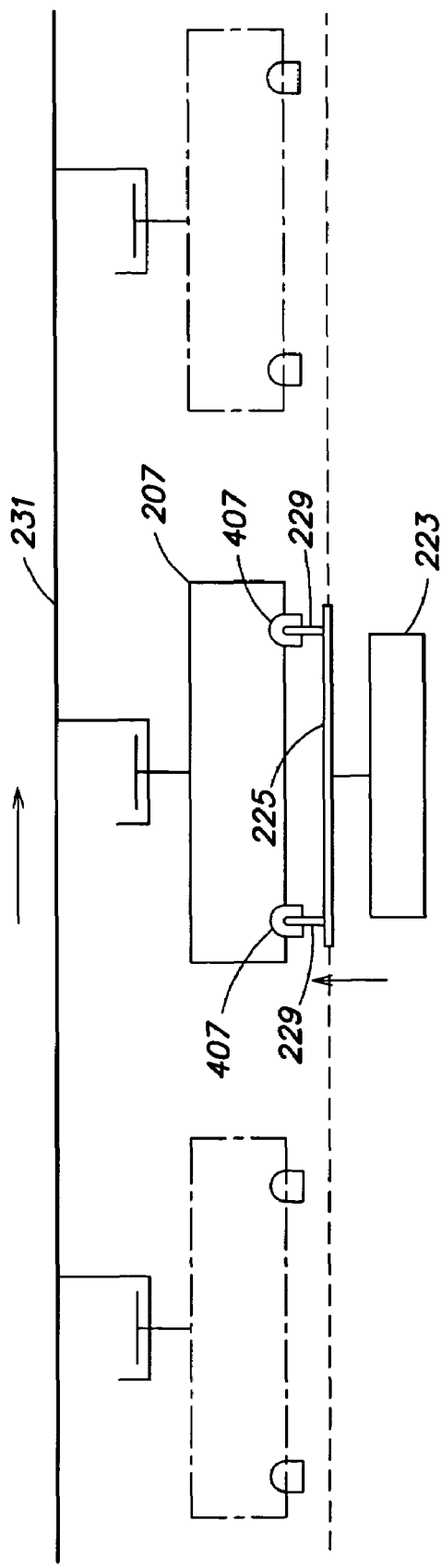
Figure 4C:
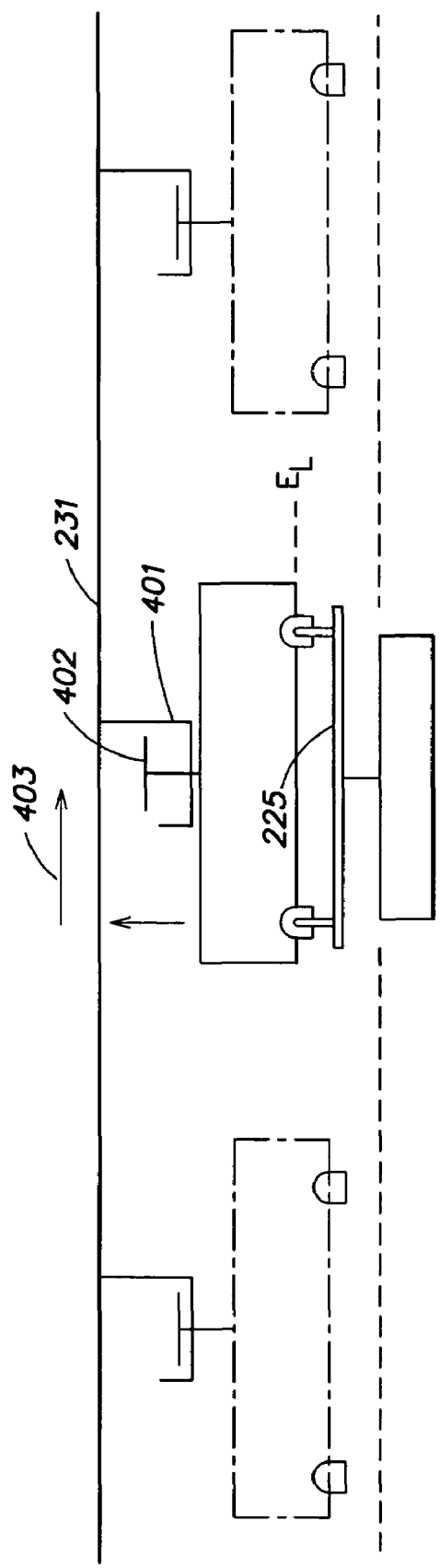

Assuming the end effector 225 is properly positioned relative to the target substrate carrier 207, following step 307 and/or step 309 in the process of FIG. 3 is step 311. At step 311, the controller 237 controls the substrate carrier handler 215 such that the end effector 225 is raised (e.g., the horizontal guide 221 is raised on the vertical guides 217, 219 to raise the end effector 225) while continuing to substantially match the horizontal speed (and/or instantaneous position) of the end effector 225 to the speed (and/or instantaneous position) of the target substrate carrier 207. The raising of the end effector 225 causes the kinematic pins 229 thereof to come into engagement with concave features 407 on the bottom of the target substrate carrier 207. Thus the end effector 225 is moved to an elevation at which the conveyor 231 transports substrate carriers 207. In this manner, the end effector 225 contacts the bottom of the target substrate carrier 207 (FIG. 4B). As the end effector 225 continues to be raised (while the end effector continues to substantially match horizontal speed and/or position with the target substrate carrier 207), the target substrate carrier 207 (and in particular its top flange 402) is lifted out of engagement with the carrier engagement member 401 of the conveyor 231, as illustrated in FIG. 4C.

Figure 4D:
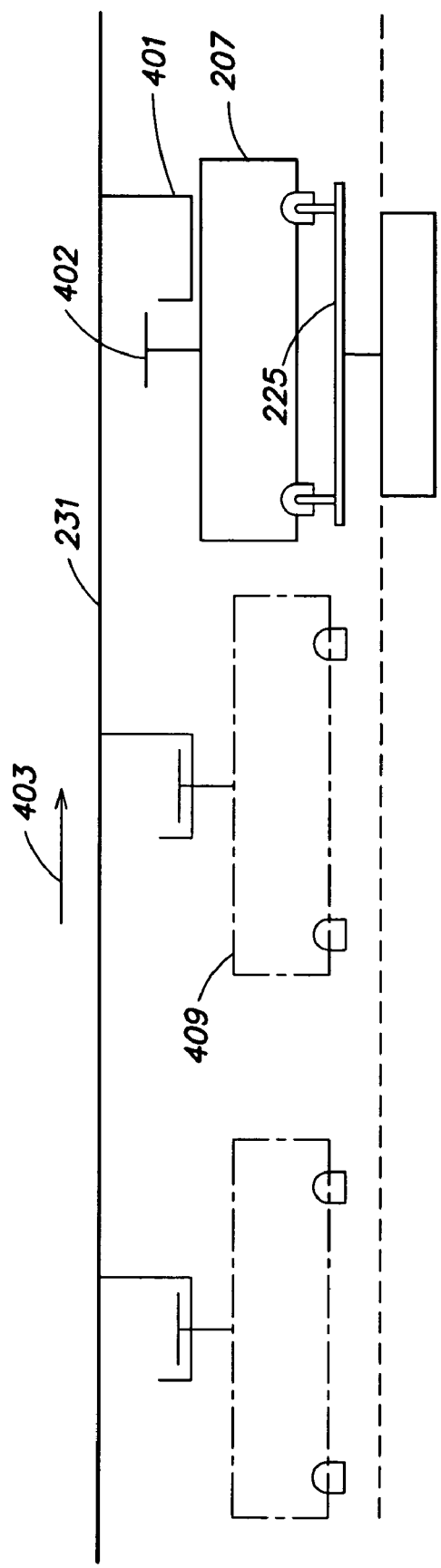

Next, in step 313 of FIG. 3, the controller 237 controls the substrate carrier handler 215 to decelerate horizontal motion of the end effector 225 slightly, thereby decelerating the target substrate carrier 207. The degree of deceleration is such that the target substrate carrier 207 continues to move in the direction indicated by the arrow 403, but at a slower speed than the conveyor 231. This allows the carrier engagement member 401 (which had engaged the flange 402 of the target substrate carrier 207) to move ahead of the flange 402, as indicated in FIG. 4D. Once the carrier engagement member 401 has moved out from underneath the flange 402 (as shown in FIG. 4D), the end effector 225 may be accelerated again, so that the horizontal speed of the end effector 225 and the target substrate carrier 207 supported thereon again substantially matches the horizontal speed of the conveyor 231 to prevent another substrate carrier being transported by the conveyor 231 (e.g., substrate carrier 409 in FIG. 4D) from colliding with the target substrate carrier 207.

Figure 4E:
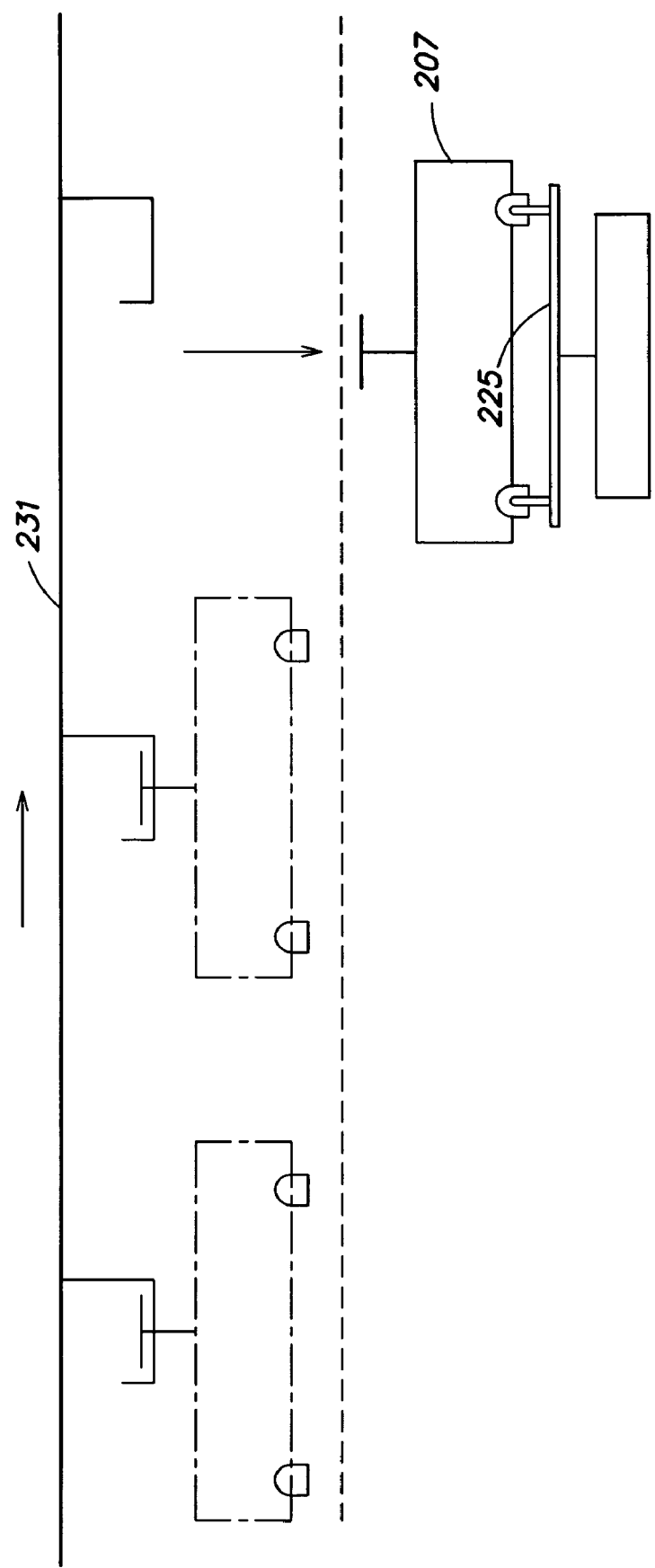

In step 315 in FIG. 3, the end effector 225 is lowered (e.g., by lowering the horizontal guide 221 along the vertical guides 217, 219) to lower the target substrate carrier 207 away from the conveyor 231. The lowering of the target substrate carrier 207 is illustrated in FIG. 4E. The end effector 225, having the target substrate carrier 207 supported thereon, may then be decelerated (step 317, FIG. 3) and brought to a halt. As stated, in at least one embodiment of the invention, the above-described end effector 225 accelerations, decelerations, raisings and/or lowerings may be defined by the motion profile determined for the end effector 225.

In step 319, the substrate carrier handler 215 may transport the target substrate carrier 207 supported on the end effector 225 to one of the docking stations 203 (FIG. 2). Alternatively, if the loading station 201 includes one or more storage shelves or other storage locations (e.g., storage shelf 239, shown in phantom in FIG. 2, and adapted to store a substrate carrier), the substrate carrier handler 215 may transport the target substrate carrier 207 to one of the storage locations. (Other and/or more storage locations may be employed). The process of FIG. 3 then ends in step 321.

Assuming that the target substrate carrier 207 is brought to one of the docking stations 203, the target substrate carrier 207 may be handed off by the substrate carrier handler 215 to the docking gripper 211 of the respective docking station 203. The target substrate carrier 207 then may be docked at the docking station 203, and opened by the substrate carrier opener 213 of the docking station 203 to allow extraction of a target substrate from the target substrate carrier 207 (e.g., by a substrate handler such as the FI robot 119 of FIG. 1). The extracted substrate may be transferred to a processing tool associated with the substrate loading station 201 (e.g., the processing tool 113 of FIG. 1) and one or more fabrication processes may be applied to the substrate by the processing tool. Upon completion of the processing in the processing tool, the substrate may be returned to the target substrate carrier 207 at the docking station 203 and the target substrate carrier 207 may be closed and undocked from the docking station 203. The substrate carrier handler 215 then may transport the target substrate carrier 207 away from the docking station 203 and to a position just below the conveyor 231 (e.g., assuming the substrate carrier 207 is to be returned to the conveyor 231 rather than stored at a storage location such as the storage location 239). That is, with the substrate carrier 207 supported on the end effector 225, the horizontal guide 221 may be moved near the upper ends 217a, 219a of the vertical guides 217, 219, and the support 223 may be moved to the upstream end 221a of the horizontal guide 221. The substrate carrier 207 then may be transferred back onto the conveyor 231 as described below with reference to FIGS. 5–6E.

Figure 5:
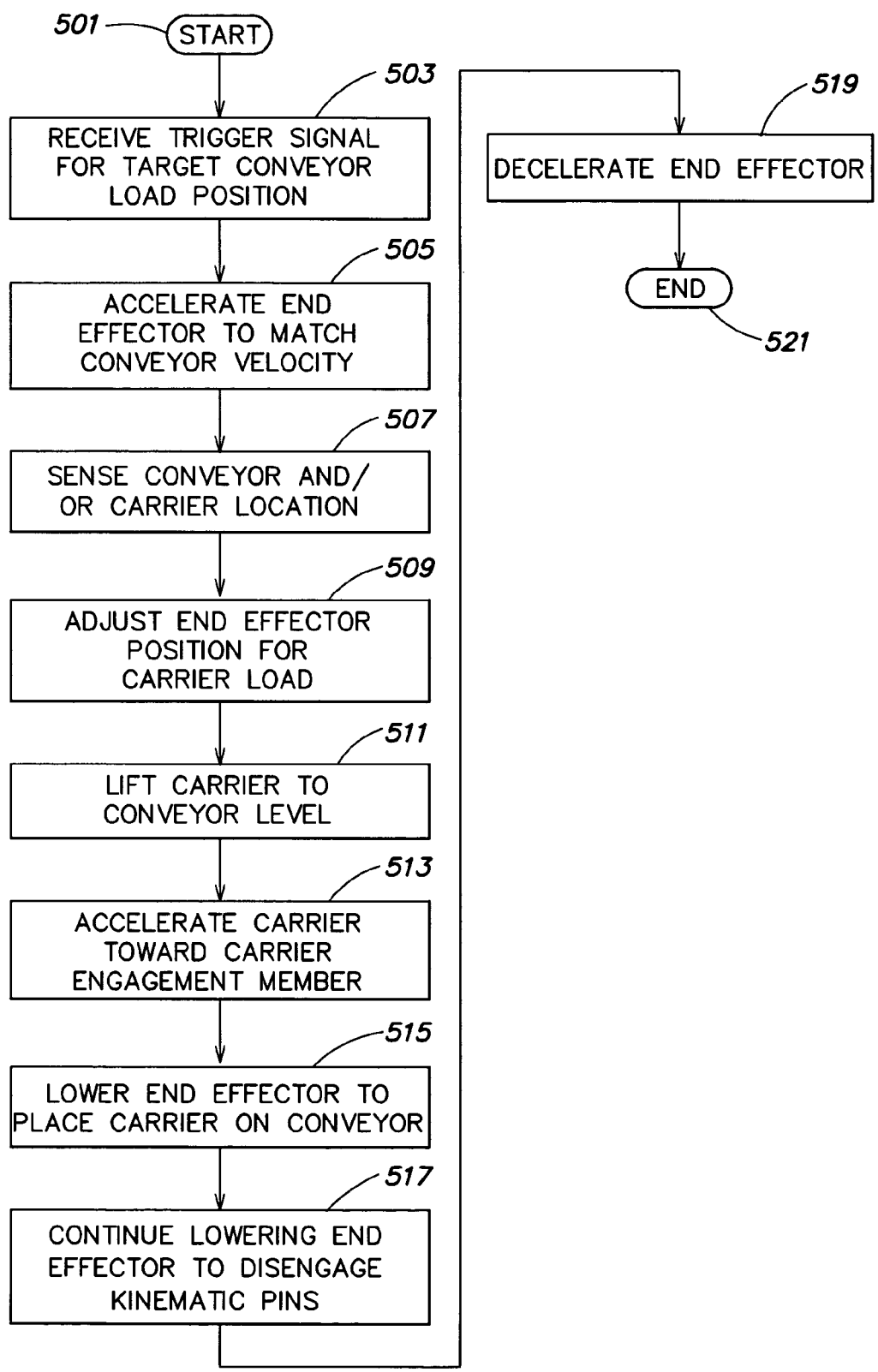
FIG. 5 is a flow chart that illustrates an exemplary process performed in accordance with the invention to load a substrate carrier onto a moving conveyor.

An exemplary process that may be performed in accordance with the invention for loading a target substrate carrier 207 onto the conveyor 231 will now be described with reference to FIGS. 5–6E. FIG. 5 is a flow chart that illustrates the inventive substrate carrier loading process. FIGS. 6A–6E are schematic side views showing various stages of the process of FIG. 5.

The process of FIG. 5 starts at step 501 and continues with step 503. At step 503 the controller 237 receives a signal (e.g., from the sensor 233 or 235) indicating the presence of a vacant carrier engagement member 401 of the conveyor 231. In response to this signal, in step 505, the controller 237 controls the substrate carrier handler 215 so that the end effector 225 (with the target substrate carrier 207 to be transferred to the conveyor 231 thereon) is accelerated along the horizontal guide 221 to substantially match the motion of the vacant carrier engagement member 401 (and/or the conveyor 231). For example, the end effector 225 may substantially match the speed and position of the vacant carrier engagement member 401 in the horizontal direction.

In at least one embodiment of the invention, prior to accelerating the end effector 225 so that it substantially matches the position and speed of the vacant carrier engagement member 401 (step 305), the controller 237 employs the sensor 233 to determine a speed of the conveyor 231. Position of the conveyor 231 also may be determined. Based on the speed of the conveyor 231, the controller 237 may determine a motion profile for the end effector 225 and direct motion of the end effector 225 in accordance with the motion profile to substantially match the speed and position of the end effector 225 (with the target substrate carrier 207 thereon) to the vacant carrier engagement member 401 onto which the target substrate carrier 207 is to be loaded. The motion profile may be "predetermined", such that the controller 237 only allows the end effector 225 to begin performing a load operation (e.g., begin accelerating) if the speed of the conveyor 231 is within a predetermined speed range (e.g., a range that ensures that the end effector 225 will be properly aligned with the vacant carrier engagement member 401 if the end effector 225 is accelerated in accordance with the predetermined motion profile); otherwise, the process of FIG. 5 ends.

Alternatively, the controller 237 may employ the speed of the conveyor 231 to determine a motion profile for the end effector 225 (e.g., using a look up table of predetermined motion profiles, using an algorithm to calculate the motion profile, etc.). It will be understood that carrier engagement member speed, rather than conveyor speed may be measured and employed to determine a motion profile or whether to employ a predetermined motion profile for the end effector 225. Each motion profile may include all of the accelerations, decelerations, raisings and lowerings (described below) employed by the end effector 225 during a load operation.

Figure 6A:
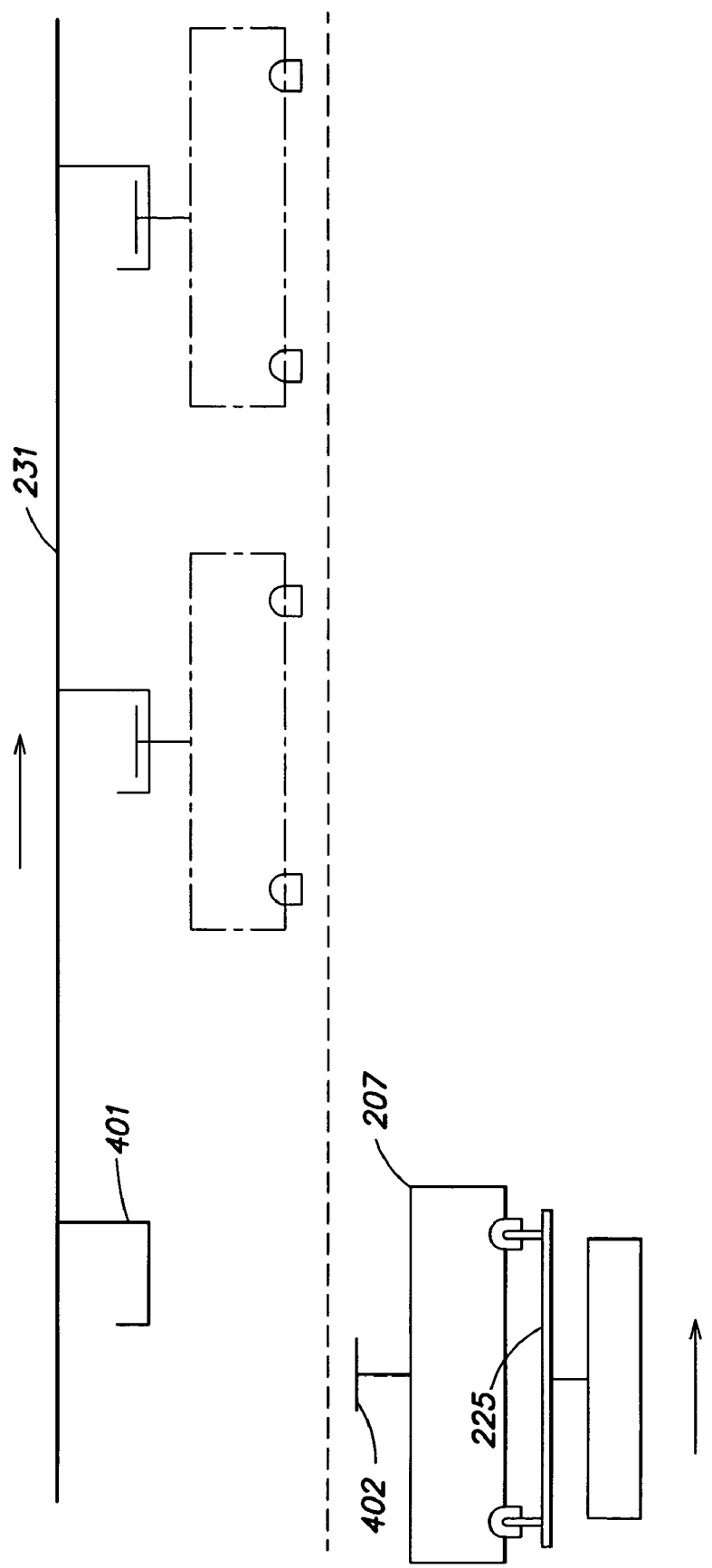
FIGS. 6A–6E are schematic side views showing various stages of the process of FIG. 5.

FIG. 6A shows the end effector 225 being moved at a substantially matching velocity with the conveyor 231, and with the flange 402 of the target substrate carrier 207 below and slightly behind the carrier engagement member 401 on which the target substrate carrier 207 is to be loaded. In this manner, the target substrate carrier 207 may be raised without the flange 402 being obstructed by the carrier engagement member 401 during transfer of the target substrate carrier 207 to the conveyor 231 as described below. In general, the flange 402 of the target substrate carrier 207 may be positioned at any location that allows the carrier to be raised without contacting the carrier engagement member 401 on which the target substrate carrier 207 is to be loaded and the carrier engagement member (and/or a substrate carrier positioned thereon) that follows the carrier engagement member 401 on which the target substrate carrier 207 is to be loaded.

Following step 505 is step 507 at which the relative horizontal positioning of the target substrate carrier 207 and the carrier engagement member 401 are sensed (e.g., by the sensor 235, FIG. 2). For example, if the sensor 235 comprises a light source/detector pair, the sensor 235 may emit a beam of light toward the vacant carrier engagement member 401 (or the conveyor 231) that is only detected by the sensor 235 if the end effector 225 is properly positioned relative to the vacant carrier engagement member 401.

In at least one embodiment of the invention, if the end effector 225 is not properly positioned relative to the vacant carrier engagement member 401, then the process of FIG. 5 ends. Alternatively, in another embodiment of the invention, any necessary adjustments may be made in the relative horizontal positioning of the target substrate carrier 207 and the carrier engagement member 401 (Step 509) (e.g., to ensure that the flange 402 does not contact the carrier engagement member 401 when the target substrate carrier 207 is raised as described below). For example, the controller 237 may accelerate and/or decelerate the end effector 225 until a proper alignment signal is received from the sensor 235. During such position adjustment, the horizontal speed of the target substrate carrier 207 and the horizontal speed of the conveyor 231 and/or the carrier engagement member 401 may remain substantially matched.

Figure 6B:
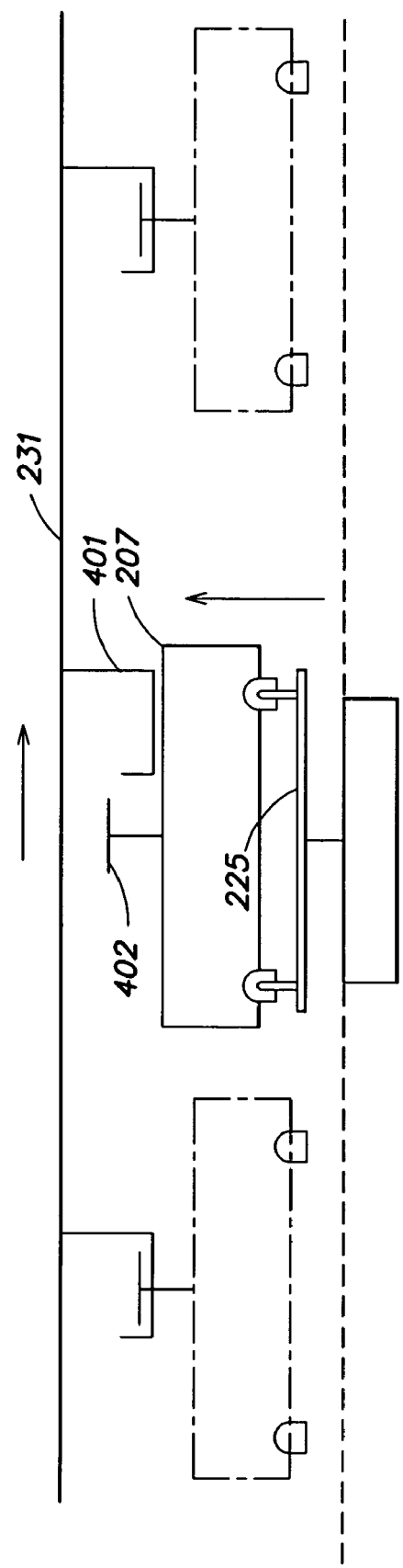

Assuming the end effector 225 is properly positioned relative to the vacant carrier engagement member 401, in step 511, and shown in FIG. 6B, the end effector 225 is raised, by raising the horizontal guide 221 along the vertical guides 217, 219 (FIG. 2), so that the target substrate carrier 207 and particularly its flange 402, are brought up to the level of the carrier engagement member 401. As shown in FIG. 6B, the flange 402 is positioned slightly above the carrier engagement member 401 (e.g., for loading thereon as described below).

Figure 6C:
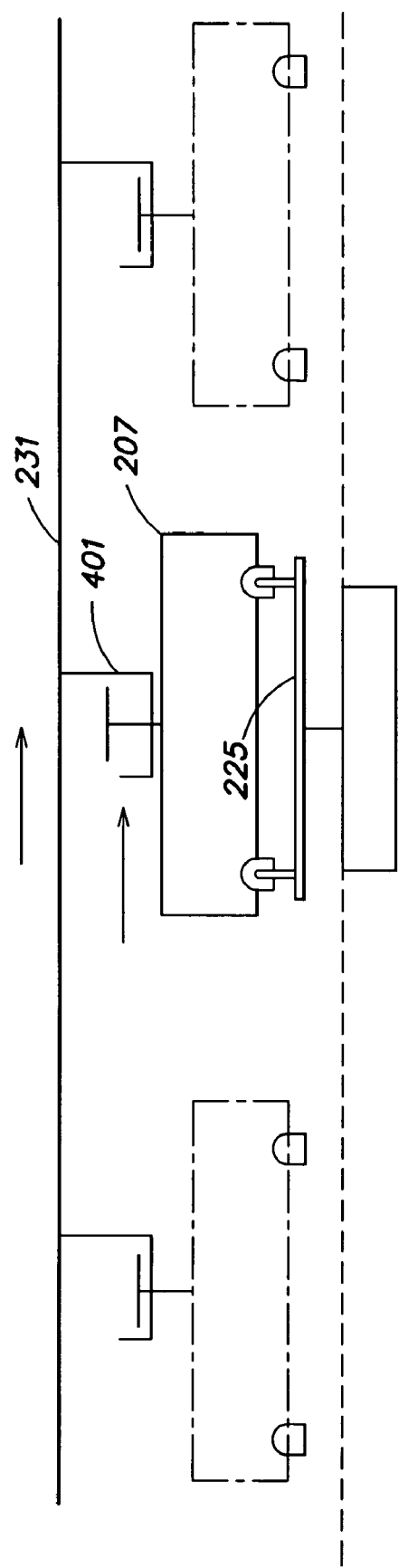
Figure 6D:
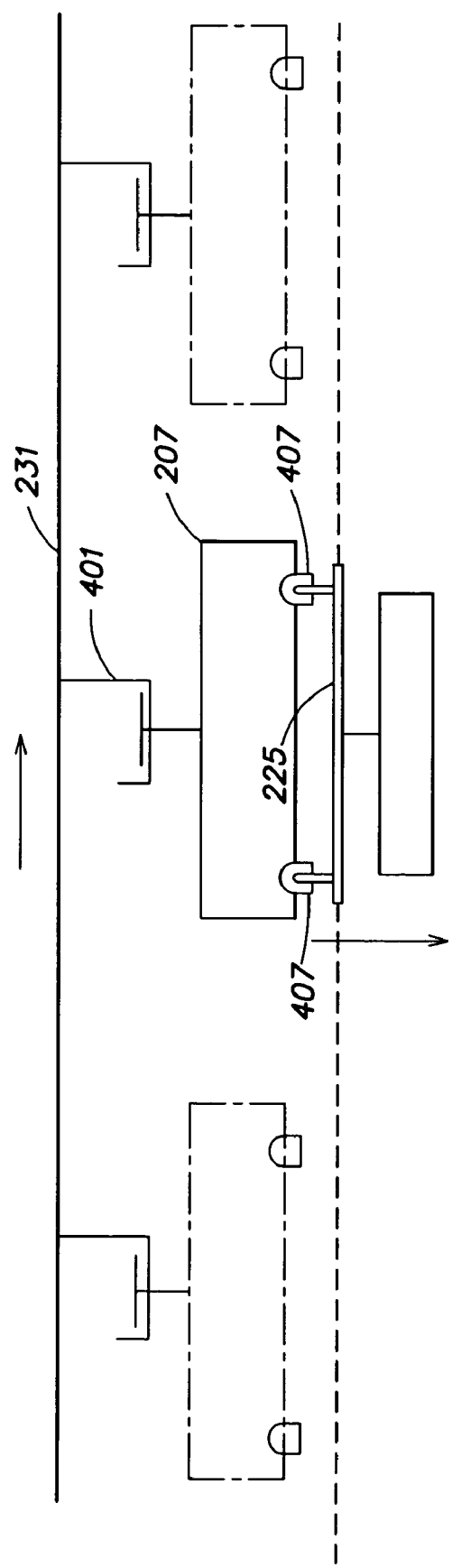
Figure 6E:
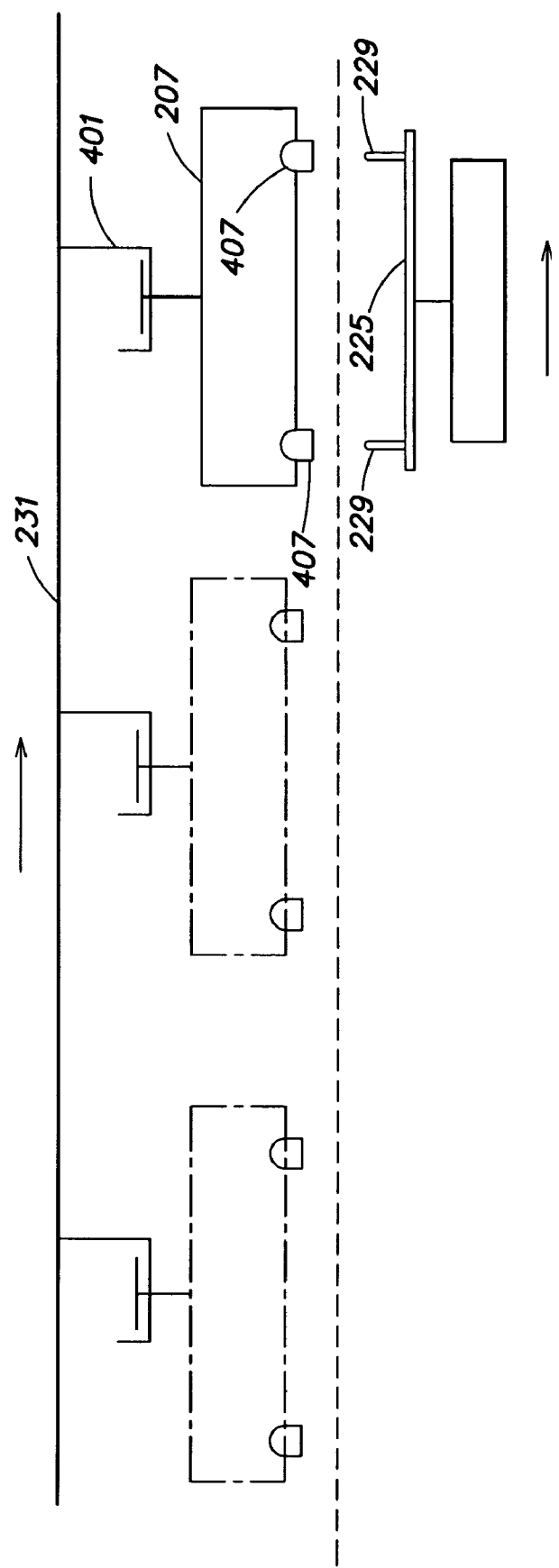

Next, as represented by step 513 and shown in FIG. 6C, the target substrate carrier 207 is accelerated to bring the flange 402 of the target substrate carrier 207 above the carrier engagement member 401 of the conveyor 231. The target substrate carrier 207 is then decelerated, so that the horizontal speed of the target substrate carrier 207 again substantially matches the horizontal speed of the conveyor 231. Next, as illustrated in FIG. 6D and represented by step 515, the end effector 225 is lowered (while continuing to substantially match the horizontal speed of the conveyor 231), to bring the flange 402 of the target substrate carrier 207 into engagement with the carrier engagement member 401 of the conveyor 231, thereby handing off the target substrate carrier 207 to the carrier engagement member 401. The substrate carrier handler 215, under control of the controller 237, continues to lower the end effector 225, (e.g., while continuing to substantially match the horizontal speed of the conveyor 231), so that the kinematic pins 229 of the end effector 225 are disengaged from the features 407 on the bottom of the target substrate carrier 207. An exemplary result of step 517 is illustrated in FIG. 6E.

After the end effector 225 is disengaged from the target substrate carrier 207, in step 519 the end effector 225 is decelerated (e.g., halted) and the process of FIG. 5 ends (step 521). Meanwhile, the target substrate carrier 207, which is supported via its flange 402 by the carrier engagement member 401 of the conveyor 231, is transported away from the loading station 201 by the conveyor 231. As stated, in at least one embodiment of the invention, the above-described end effector 225 accelerations, decelerations, raisings and/or lowerings may be defined by the motion profile determined for the end effector 225.

Thus the substrate loading station 201 provided in accordance with the invention, and in particular the substrate carrier handler 215 operating under the control of the controller 237, functions to unload substrate carriers from a moving conveyor and to load substrate carriers onto the moving conveyor. In this manner, the inventive substrate loading station and substrate carrier handler may reduce substrate dwell time within a fabrication facility, work-in-progress, and working capital and manufacturing costs.

In accordance with the invention, the controller 237 may be programmed to perform one or both of the processes of FIGS. 3 and 5. Also the processes of FIGS. 3 and 5 may be embodied in one or more computer program products. Each computer program product may be carried by a medium readable by a computer (e.g., a carrier wave signal, a floppy disk, a hard drive, a random access memory, etc.).

In at least one embodiment of the invention, the inventive substrate loading station 201 may be configured to automatically retract the end effector 225 away from the conveyor 231 in the event of a power failure, emergency shutdown, etc. For example, the controller 237 may include an end effector retraction routine which automatically retracts the end effector 225 (and/or the horizontal guide 221) away from the conveyor 231 in response to a predetermined interrupt such as a power failure, emergency shutdown, or the like. Further, the end effector 225 (and/or the horizontal guide 221) may be biased so that the end effector 225 (and/or the horizontal guide 221) automatically retracts when power is removed from the substrate loading station 201. Any suitable biasing mechanism such as springs, gravity, air cylinders, ball screws, lead screws, etc., may be employed. The above mentioned end effector retraction routine may be implemented, for example, as one or more computer program products.

Exemplary parameters that may affect design of the substrate loading station 201 include, for example, (1) conveyor speed; (2) horizontal and/or vertical speed at which the substrate carrier handler 215 can move the end effector 225; (2) horizontal and/or vertical acceleration and deceleration that may be applied to the end effector 225 of the substrate carrier handler 215; (4) horizontal and vertical range of movement of the end effector 225 of the substrate carrier handler 215; (5) distance between adjacent substrate carriers 207 transported by the conveyor 231; (6) elevation at which the conveyor 231 transports the substrate carriers 207; (7) vertical distance a substrate carrier 207 should be lifted to clear the carrier engagement member 401 of the conveyor 231 used to transport the substrate carrier 207; (8) height (e.g., vertical dimension) of each substrate carrier 207; (9) distance a substrate carrier 207 must be lowered, after being released from a carrier engagement member 401, to allow substrate carriers being transported by the conveyor 231 to pass over the released substrate carrier 207 without striking the released substrate carrier 207; (10) the type of carrier engagement number employed; and/or (11) other similar parameters.

For example, in at least one embodiment of the invention, the inventive substrate carrier handler 215 should be capable of (1) achieving a maximum horizontal speed for the end effector 225 that is greater than or equal to the horizontal speed of the conveyor 231; (2) raising the end effector 225 to an elevation sufficient to disengage and clear a substrate carrier 207 from a conveyor carrier engagement member 401; (3) moving at two or more horizontal speeds, such as a first horizontal speed for matching conveyor speed and a second horizontal speed for transporting a substrate carrier 207 to and from a docking station 203; (4) moving at two or more vertical speeds, such as a first vertical speed for disengaging a substrate carrier 207 from or handing off a substrate carrier 207 to the conveyor 231, and a second vertical speed for transporting a substrate carrier 207 to and from a docking station 203; and/or (5) performing all accelerations and decelerations of a substrate carrier 207 supported by the end effector 225 (and required for substrate carrier engagement with or disengagement from the conveyor 231) without damaging a substrate or substrates contained in the substrate carrier 207.

Likewise, the substrate carrier handler 215 should operate so as to lower its end effector 225 to a sufficiently low level to service the lowest docking station 203. (If a storage shelf or other storage location is present that is lower than the lowest docking station 203, then the substrate carrier handler 215 should be further operative to lower the end effector 225 to service the lowest storage shelf/location). The horizontal range of travel for the end effector 225 provided on the horizontal guide 221, and the mechanism for moving the end effector 225 should be such that the end effector 225 is able to accelerate to a horizontal speed substantially matching conveyor speed, disengage a substrate carrier 207 from and/or engage a substrate carrier 207 with the conveyor 231

(while avoiding a collision with other substrate carriers being transported on the conveyor 231), and decelerate to a halt, all within the available horizontal range of travel provided by the horizontal guide 221.

It is contemplated to include some or all of the above described features/parameters in one or more embodiments of the inventive substrate loading station.

Figure 7A:
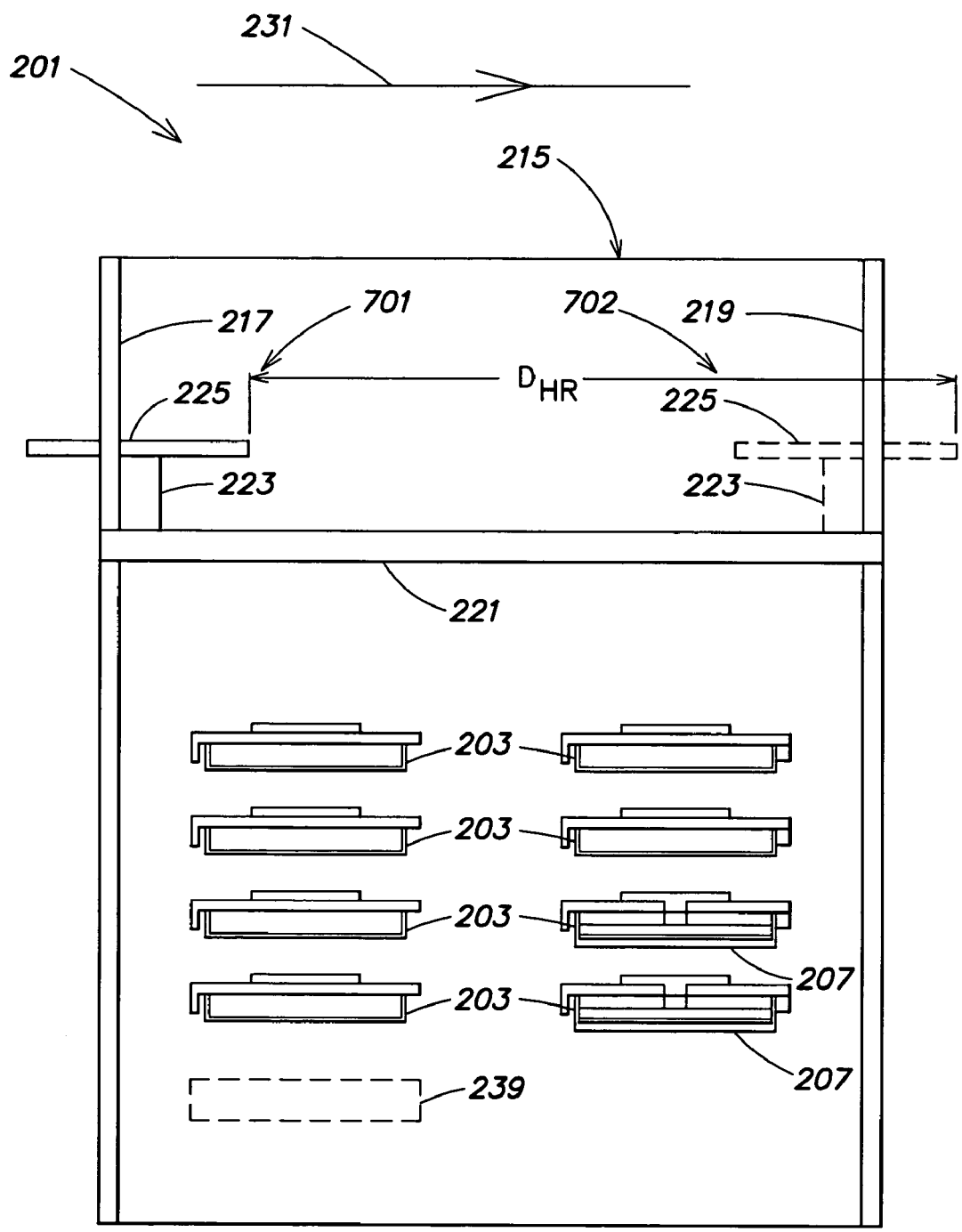
FIGS. 7A and 7B are simplified front elevational views of the inventive substrate loading station, similar to FIG. 2.
Figure 7B:
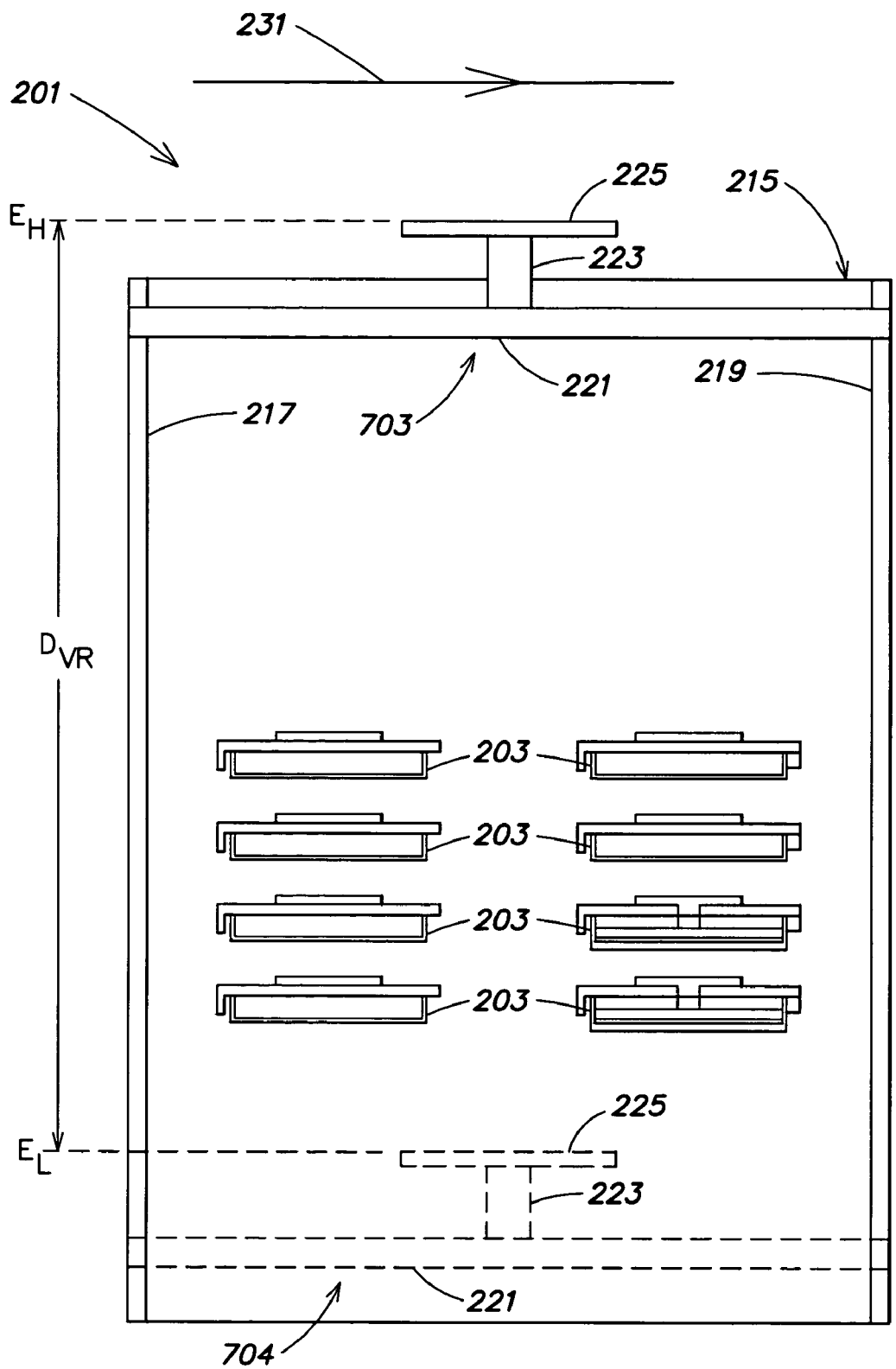
Figure 7C:
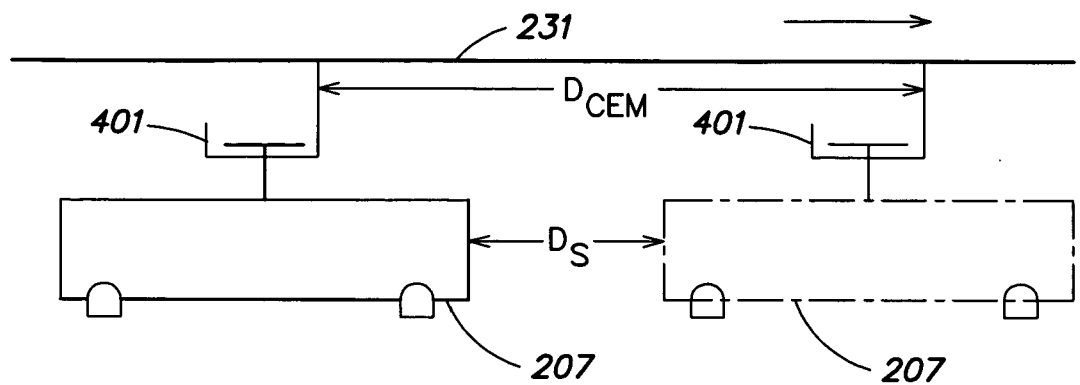
FIGS. 7C–7D are simplified schematic side views illustrating a moving conveyor similar to FIGS. 4A–4E and 6A–6E.
Figure 7D:
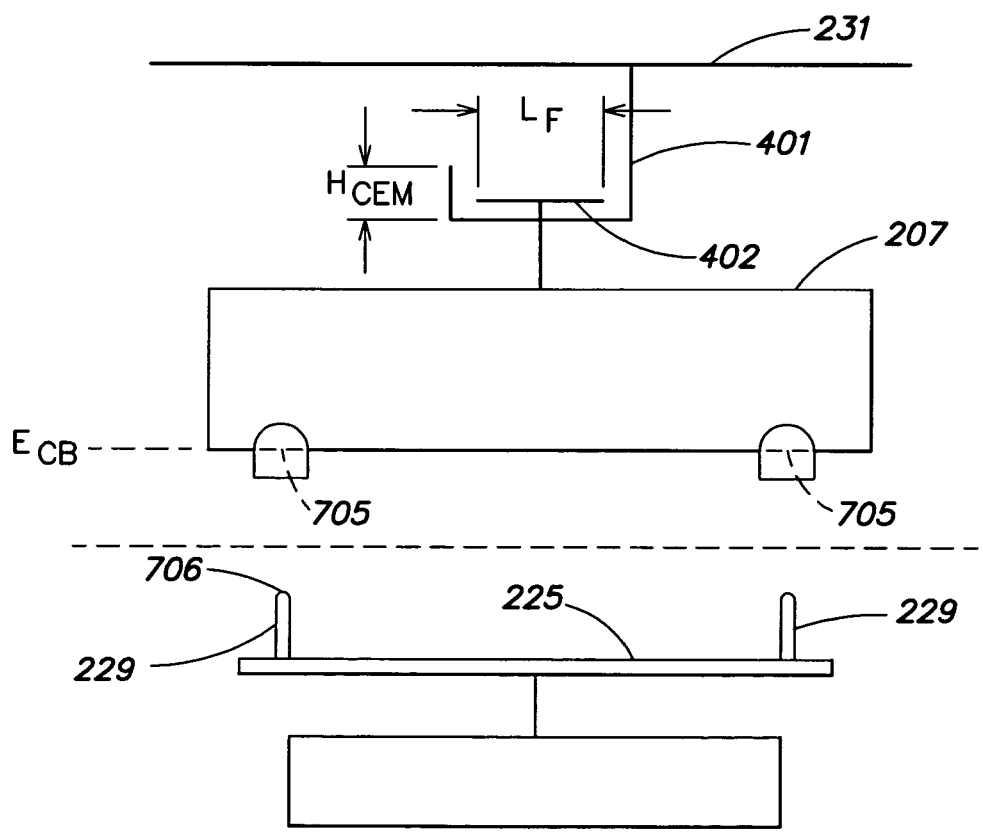

Various factors and parameters that may be considered in designing a particular embodiment of the inventive substrate loading station 201 and/or programming the controller 237 (FIG. 2) will now be discussed with reference to FIGS. 7A–7D. FIGS. 7A and 7B are simplified front elevational views of the inventive substrate loading station 201, similar to FIG. 2. FIGS. 7C–7D are simplified schematic side views of a substrate carrier during engagement with and/or disengagement from the conveyor 231 similar to FIGS. 4A–4E and 6A–6E.

The horizontal range of the end effector 225 of the substrate carrier handler 215 is illustrated in FIG. 7A. The end effector 225 and the support 223 are shown in solid outline at 701 in a position at the upstream limit of movement of the end effector 225 along the horizontal guide 221 of the substrate carrier handler 215. The end effector 225 and the support 223 are also shown in phantom at 702 in a position at the downstream limit of movement of the end effector 225 along the horizontal guide 221. A distance $D_{HR}$ illustrated in FIG. 7A represents the maximum horizontal range of travel of the end effector 225.

Selection of the horizontal range of travel $D_{HR}$, in addition to being influenced by the design factors discussed above, may also be influenced by the positioning of the docking stations 203 or shelves 239 (e.g., the horizontal span of the docking stations or shelves), the desired footprint for the substrate loading station 201, the size of the factory interface or processing tool coupled to the substrate loading station 201, and/or the like.

The vertical range of travel of the end effector 225 is illustrated in FIG. 7B. The end effector 225, the support 223 and the horizontal guide 221 are shown in solid outline at 703 at the upper limit of the range of vertical movement of the end effector 225. At that position, the end effector 225 is at an elevation $E_H$, which is high enough to clear the flange 402 of a substrate carrier 207 from a carrier engagement member 401 of the conveyor 231 (see FIGS. 4B–4D).

Continuing to refer to FIG. 7B, the end effector 225, the support 223 and the horizontal guide 221 are shown in phantom at 704 at the lower limit of the range of vertical movement of the end effector 225. At that position, the end effector 225 is at an elevation $E_L$, which is the lowest elevation required to service the lowest docking station (or storage location) of the substrate loading station 201. A distance $D_{VR}$ illustrated in FIG. 7B represents the maximum vertical range of travel of the end effector 225 (e.g., $D_{VR}=E_H-E_L$). Other vertical ranges of travel may be employed.

Parameters which affect an operation for engaging or disengaging a substrate carrier 207 from the conveyor 231 are illustrated in FIGS. 7C–7D. FIG. 7C shows a distance $D_S$ which separates two adjacent substrate carriers 207 being transported by the conveyor 231. The separation distance $D_S$ is related to, but less than, a distance $D_{CEM}$ between the carrier engagement members 401, and is also related to a horizontal dimension of the substrate carriers 207. Increasing the distance $D_S$ eases load and unload operations by providing a larger space and/or time period for raising, lowering, accelerating and/or decelerating a substrate carrier 207 during load and unload operations. However, increasing the distance $D_S$ generally decreases the number of substrate carriers that may be transported by the conveyor 231.

As shown in FIG. 7D, in at least one embodiment of the invention, to disengage a substrate carrier 207 from the conveyor 231, the end effector 225 raises the kinematic features 229 to an elevation equal to at least the elevation $E_{CB}$ of the bottom of the substrate carrier 207. More specifically, the kinematic features 229 are raised to an elevation greater than or equal to the elevation $E_{CB}$ plus the height $H_{CEM}$ of the seat of the carrier engagement member 401 supporting the substrate carrier 207 (e.g., to clear the flange 402 of the substrate carrier 207 from the carrier engagement member 401). Prior to lowering the disengaged substrate carrier 207, the end effector 225 is decelerated to allow the carrier engagement member 401 to move ahead of the substrate carrier 207 by a total distance greater than a length $L_F$ of the flange 402. Numerous other parameters may affect design of the inventive substrate loading station 201 and substrate handler 215.

The present invention, shown with reference to FIGS. 8–10 and described below, improves upon the high-speed load stations or substrate loading station (referenced by numeral 201 in FIG. 2, and described above with reference thereto). The improved high-speed load stations contends with the problem of vibration which may be transmitted from load stations into substrate processing tools, as more fully described below.

As the precision of modern substrate processing tools increases, processing tools become less tolerant of transmitted vibration. However, as the present disclosure shows it is beneficial to move substrate carriers to and from processing tools via high-speed overhead transfer mechanism, and high-speed load stations. High-speed substrate carrier handlers integrated within such high-speed load stations remove substrate carriers conveyors which transport substrate carriers at high speeds, and slow the substrate carriers from those high speeds to much lower speeds in order to present the substrate carriers to a loadport of a factory interface in a controlled fashion. In accordance with the present disclosure, high-speed substrate carrier handlers can be adapted, in one aspect, to accomplish this slowdown within the short footprint of conventional load stations (e.g., such as within the footprint of the Bay Distributed Stocker manufactured by Applied Materials, Inc. Likewise, after withdrawing substrate carriers from loadports, such high-speed substrate carrier handlers also accelerate substrate carriers (essentially from rest), to match a velocity of the high speed conveyor and deposit the substrate carrier on a substrate carrier support of the conveyor, also within the footprint of the conventional load stations.

High-mass/high-acceleration motions such as those described above can excite vibrations within the frame of the high-speed load stations. Such vibrations can be transmitted into the processing tool via the factory interface to which the high-speed load stations is attached and to which substrates are supplied for processing in the processing tool. At least because of the sensitivity of such processing tools to such vibration, it would be advantageous to reduce, eliminate, or cancel such vibrations so as to avoid vibration transfer to the processing tool.

To contend with this problem, the present invention, which is described in detail herein with reference to FIGS. 8–14 provides a balancing mass to generate inertial loads that are preferably substantially equivalent in magnitude to and opposite in direction to the inertial loads generated by the high-speed substrate carrier handler as it loads and unloads substrate carriers from a high speed substrate carrier conveyor. These inertial loads may be applied as in a first embodiment of the present invention, i.e., directly to guide along which an end effector of the high-speed substrate carrier handler travels, in which case the vibrations would be canceled quite close to their source. The guide of the first embodiment may include a single extrusion along which two separate carriages ride, preferably on opposite sides of the extrusion, driven by a single belt within the extrusion.

Alternatively these inertial loads (i.e., inertial loads generated by the motion of the balancing mass) may be applied as in other embodiments of the present invention, e.g., to a separate guide that is attached to the frame of the high-speed load stations directly or indirectly via a common carriage that rides vertically along one or more vertically-oriented guides mounted to the frame of a high-speed load stations and adapted to raise the high-speed substrate carrier handler to meet an overhead conveyor. In a still further embodiment, these inertial loads are applied to guide that is separate from the guides that comprise the high-speed substrate carrier handler and that is attached directly to the frame of the high-speed load stations. This separate guide is preferably at an elevation near that of the horizontal guide of the high-speed substrate carrier handler when the high-speed substrate carrier handler performs the exchange of the substrate carrier with the conveyor, and as close to the high-speed substrate carrier handler as possible.

A less preferred embodiment includes placing the path of travel of the balancing mass in line with the path of the travel of the end effector of the high-speed substrate carrier handler. A single guide housing separate drive belts arranged serially and rotating in opposite directions may be employed for this purpose. Separate guides may also be employed. Such a high-speed load stations will have the benefit of being balanced as to torque as it reduces or cancels vibration.

Figure 8:
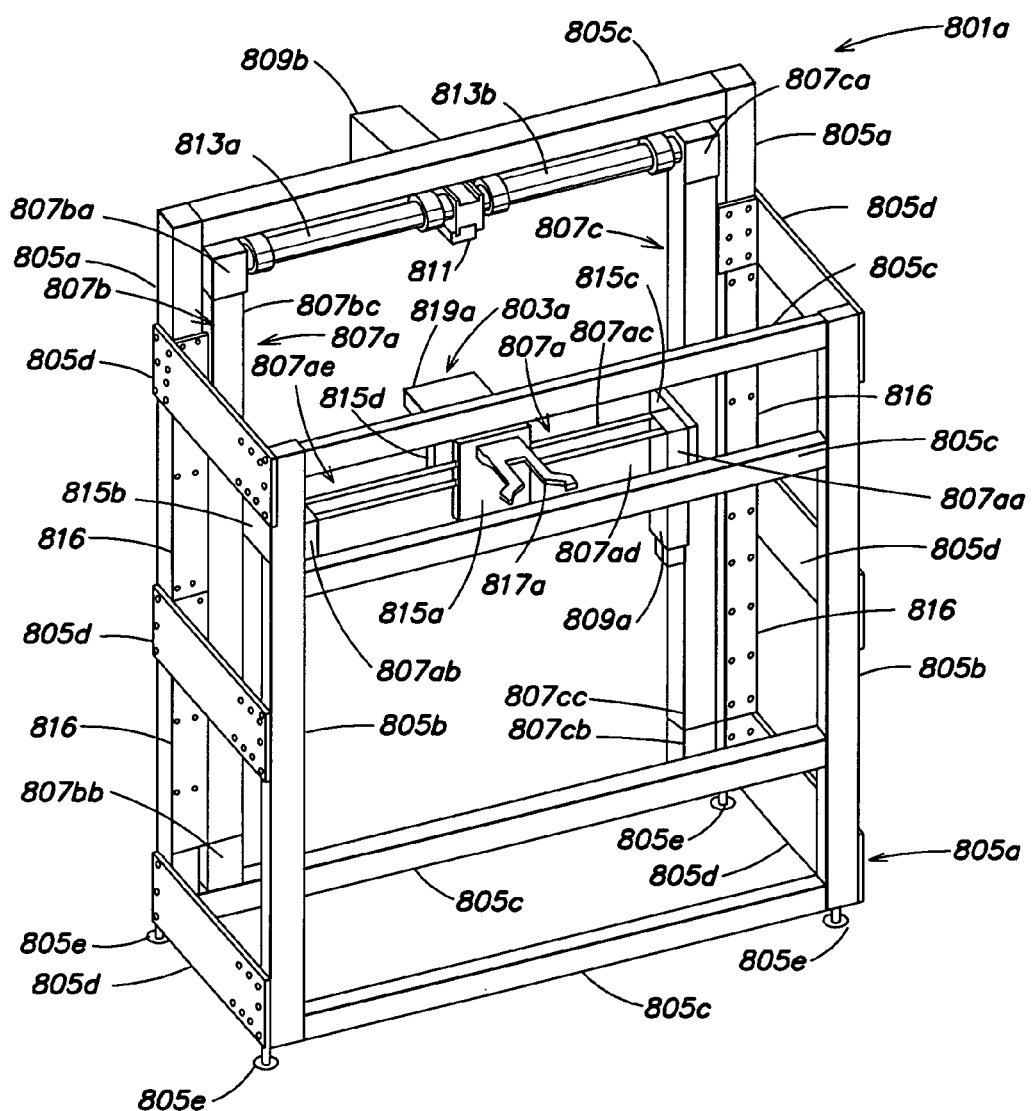
FIG. 8 is a front perspective view of a high-speed load stations equipped with a high-speed substrate carrier handler that is dynamically balanced.

FIG. 8 is a front perspective view of a high-speed load stations 801*a* equipped with a high-speed substrate carrier handler 803*a* that is dynamically balanced. The high-speed load stations 801*a* also comprises a frame 805, which supports the substrate carrier handler 803*a*. As shown, the frame 805 comprises two rear vertical supports 805*a*, two front vertical supports 805*b*, six crosspieces 805*c*, six side panels 805*d*, and four feet 805*e* for adjusting the height of the high-speed load stations 801*a*.

The substrate carrier handler 803*a* comprises a first guide 807*a* that is oriented horizontally, has a first end 807*aa*, a second end 807*ab* and a first extrusion 807*ac*, and is driven by a first motor 809*a* coupled to the first end 807*aa* of the first actuator 807*a*. The substrate carrier handler 803*a* further comprises a second actuator 807*b* that is oriented vertically, has a first end 807*ba*, a second end 807*bb* and an extrusion 807*bc*, and is driven by a second motor 809*b* coupled to the second end 807*ba* of the second actuator 807*b* via a gear box 811 and a first torquing shaft unit 813*a*. The substrate carrier handler 803*a* further comprises a third actuator 807*c* that is oriented vertically, has a first end 807*ca*, a second end 807*cb* and a third extrusion 807*cc*, and like the second actuator 807*b*, is driven by the second motor 809*b* coupled to the third actuator 807*ca* via the gear box 811 and a second torquing shaft unit 813*b*.

A first carriage 815*a* is mounted on a first vertical side 807*ad* of the horizontally-oriented first guide 807*a* for horizontal movement along the first actuator 807*a*. A belt drive (not shown) is provided within the first extrusion 807*ac* and coupled to the first carriage 815*a* to move the first carriage 815*a* horizontally along the first extrusion 807*ac*. A second carriage 815*b* is mounted on the vertically-oriented second actuator 807*b* for vertical movement along the second actuator 807*b*. A belt drive (not shown) is provided within the second extrusion 807*bc* and coupled to the second carriage 815*b* to move the second carriage 815*b* vertically along the second extrusion 807*bc*. A third carriage 815*c* is mounted on the vertically-oriented third actuator 807*c* for vertical movement along the third actuator 807*c*. A belt drive (not shown) is provided within the third extrusion 807*cc* and coupled to the third carriage 815*c* to move the third carriage 815*c* vertically along the third extrusion 807*cc*. A fourth carriage 815*d* is mounted on a second vertical side 807*ae* of the first actuator 807*a*, opposite the first vertical side 807*ad* of the first actuator 807*a*, for horizontal movement along the first actuator 807*a*. The same belt drive (not shown) that is provided within the first extrusion 807*ac* for moving the first carriage 815*a* is also preferably coupled to the fourth carriage 815*d* for moving the fourth carriage 815*d* along the first actuator 807*a*.

The second actuator 807*b* and third actuator 807*c* are preferably coupled longitudinally along respective rear vertical supports 805*a*, e.g., via a plurality of brackets 816 as shown in FIG. 8. The first guide 807*a* is mounted both to the second carriage 815*b* and to the third carriage 815*c* for vertical movement along the second extrusion 807*bc* of the second actuator 807*b* and the third extrusion 807*cc* of the third actuator 807*c*. An end effector 817*a* is mounted to the first carriage 815*a* for horizontal movement along the first extrusion 807*ac* of the first guide 807*a* on the first vertical side 807*ad* of the first actuator 807*a*, and a balancing mass 819*a* is mounted to the fourth carriage 815*d* for horizontal movement along the first extrusion 807*ac* of the first guide 807*a* on the second vertical side 807*ae* of the first actuator 807*a*.

In operation, the high-speed load stations 801*a* is preferably positioned so that the two front vertical supports 805*b* of the frame 805 are adjacent to a factory interface (FIG. 1) which in turn is commonly positioned adjacent to one or more loadlocks (not shown) of a substrate processing tool (FIG. 1). The end effector 817*a* starts adjacent one end of the first actuator 807*a*, e.g., the first end 807*aa*, and is accelerated along the first extrusion 807*ac* of the first guide 807*a* until it matches a speed of the high-speed conveyor 231 (FIG. 2) located above the first actuator 807*a*, and matches a position of a substrate carrier, e.g., substrate carrier 207 (FIG. 4A), being carried by the high-speed conveyor, the substrate carrier 207 (FIG. 4A) having been selected as a substrate carrier to be removed from the high-speed conveyor 231. The end effector 817*a* then removes the substrate carrier 207 (FIG. 4A) from the high-speed conveyor 231 (FIG. 2). The end effector 817*a* then decelerates before reaching the second end 807*ab* of the first actuator 807*a*, carrying the substrate carrier 207 (FIG. 4A) with it.

The balancing mass 819*a* is employed to reduce vibrations that might otherwise be caused by the above-described motion of the end effector relative to the frame 805. Specifically, the balancing mass 819*a* starts adjacent an end opposite to the end at which the end effector 817*a* starts, e.g., the second end 807*ab*, and is accelerated along the first extrusion 807*ac* of the first actuator 807*a*, while the end effector 817*a* is accelerating, at a rate that enables the balancing mass 819*a* to balance inertial forces arising from the accelerating end effector 817*a*. While the end effector 817*a* is moving at a constant velocity, the balancing mass 819*a* will generally also move at a constant velocity, since there are no inertial forces for the balancing mass 819*a* to balance. The balancing mass 819*a* then decelerates along the first extrusion 807*ac*, while the end effector 817*a* is decelerating, at a rate that enables the balancing mass 819a to balance the inertial forces arising from the decelerating end effector 817a. The balancing mass 819a stops decelerating when the end effector 817a stops decelerating and preferably comes to rest adjacent the second end 807ab of the first actuator 807a. Similar motion of the balancing mass can take place at times when the end effector 817a is employed to place a substrate carrier, e.g., substrate carrier 207, on the high-speed substrate carrier conveyor 231 (FIG. 2).

Vertical movement of the first guide 807a along the second extrusion 807bc of the second actuator 807b and the third extrusion 807cc of the third actuator 807c enables the end effector 817a to be raised to an elevation of the high-speed conveyor 231 (FIG. 2). Once the speed and position of the end effector 817a matches those of a substrate carrier to be removed (i.e., a "target" substrate carrier), e.g., the substrate carrier 207 of FIG. 4A, additional vertical movement causes the end effector 817a to be raised again to disengage the substrate carrier 207 (FIG. 4A) from the conveyor 231 (FIG. 2). Additional vertical movement allows the end effector 817a to be lowered from the vicinity of the conveyor 231 (FIG. 2) after the disengagement of the substrate carrier 207 (FIG. 4A) is complete.

Figure 10A:
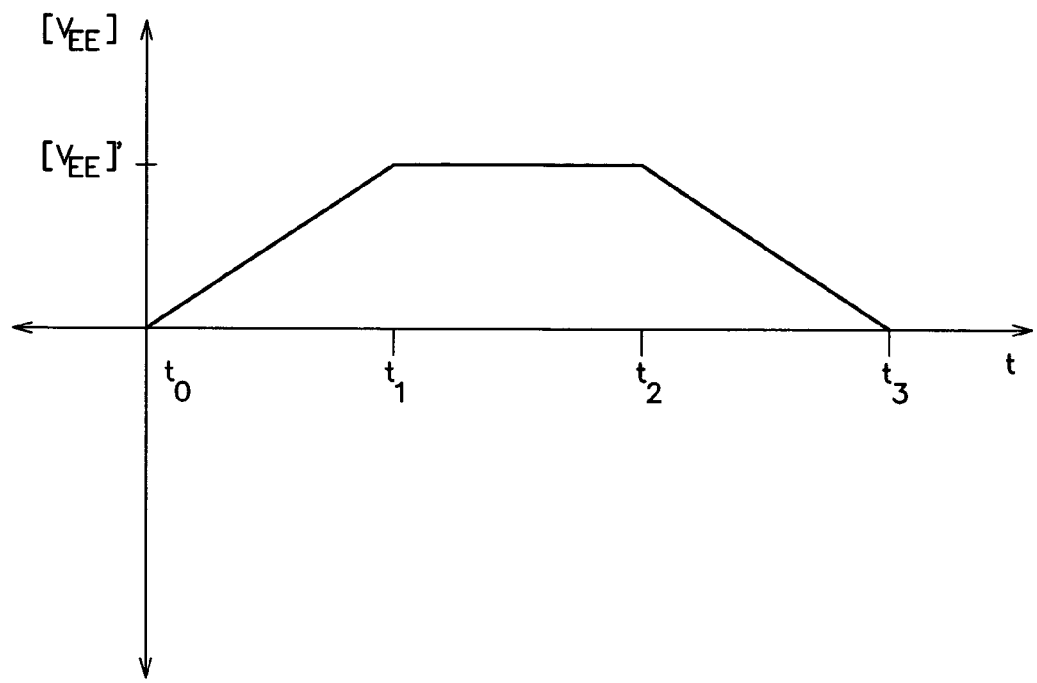
FIG. 10A includes a plot of the magnitude of the end effector velocity vector ($V_{EE}$) over time as the end effector and the balancing mass move during substrate carrier transfer between the end effector and an overhead conveyor.
Figure 10B:
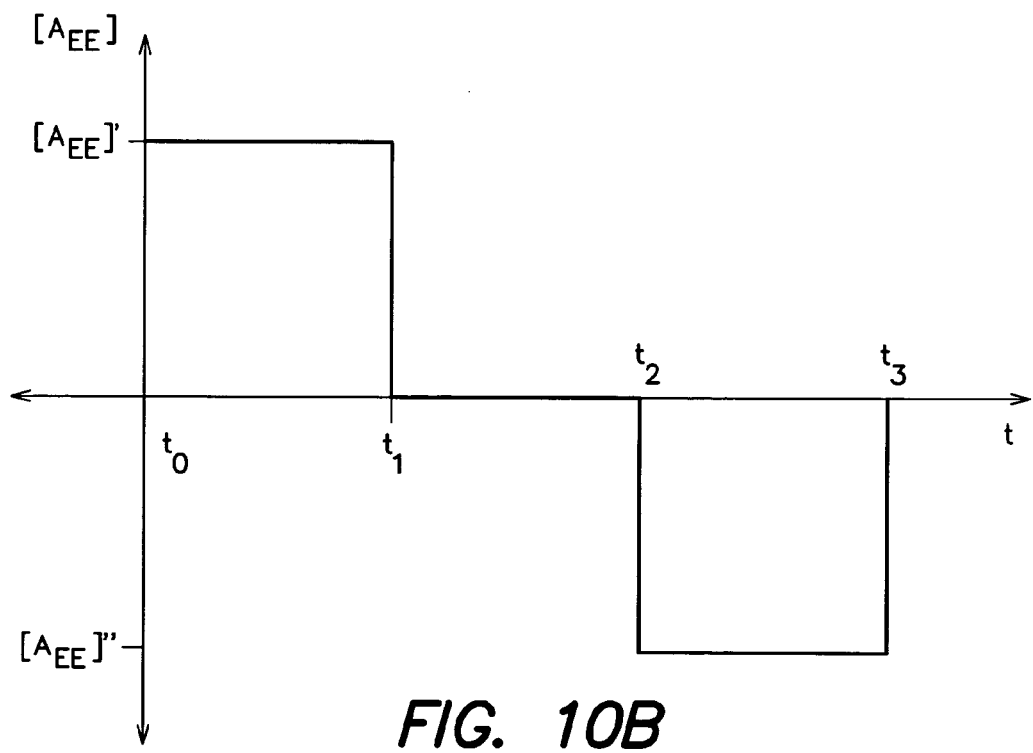
FIG. 10B includes a plot of the magnitude of the end effector acceleration vector ($A_{EE}$) over the same time period as shown in FIG. 10A.
Figure 10C:
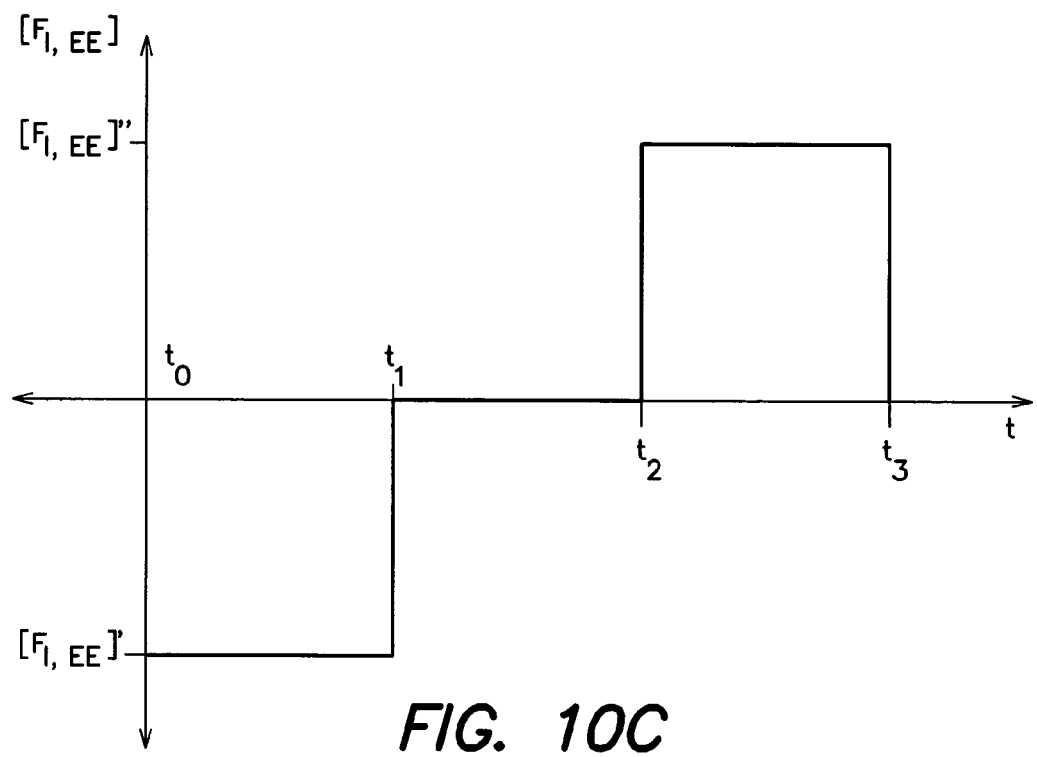
FIG. 10C includes a plot of the magnitude of the end effector inertial load vector ($F_{I,EE}$) over the same time period as shown in FIG. 10A.
Figure 10D:
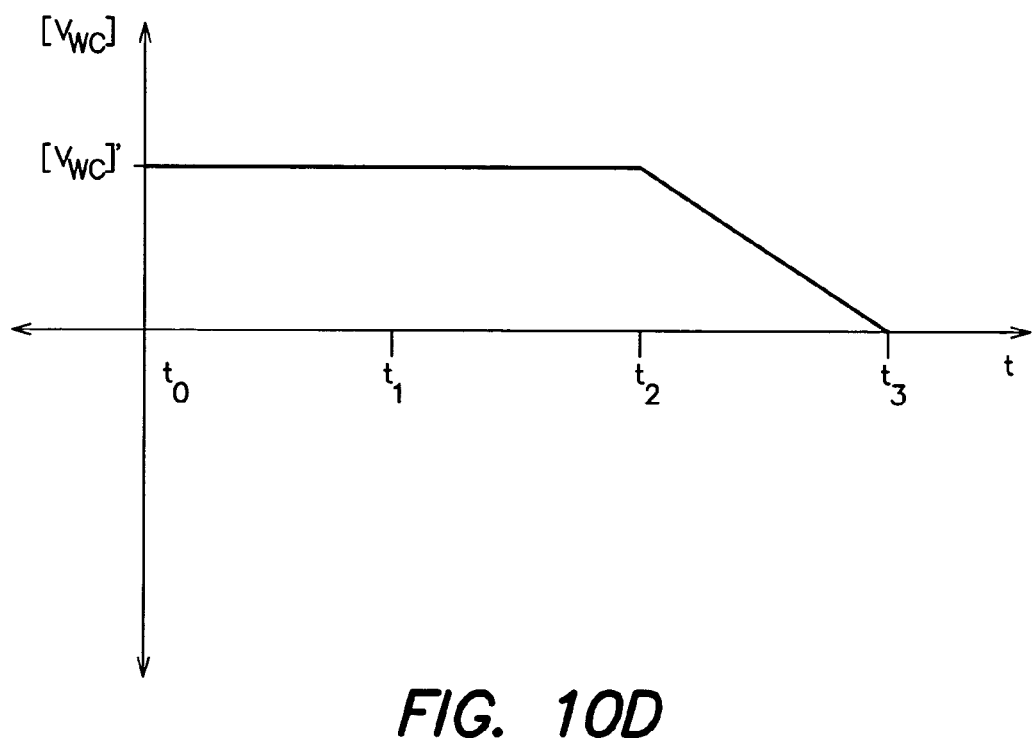
FIG. 10D includes a plot of the magnitude of the velocity vector ($V_{WC}$) of the substrate carrier to be removed from the moving high-speed conveyor over the same time period as shown in FIG. 10A.
Figure 11A:
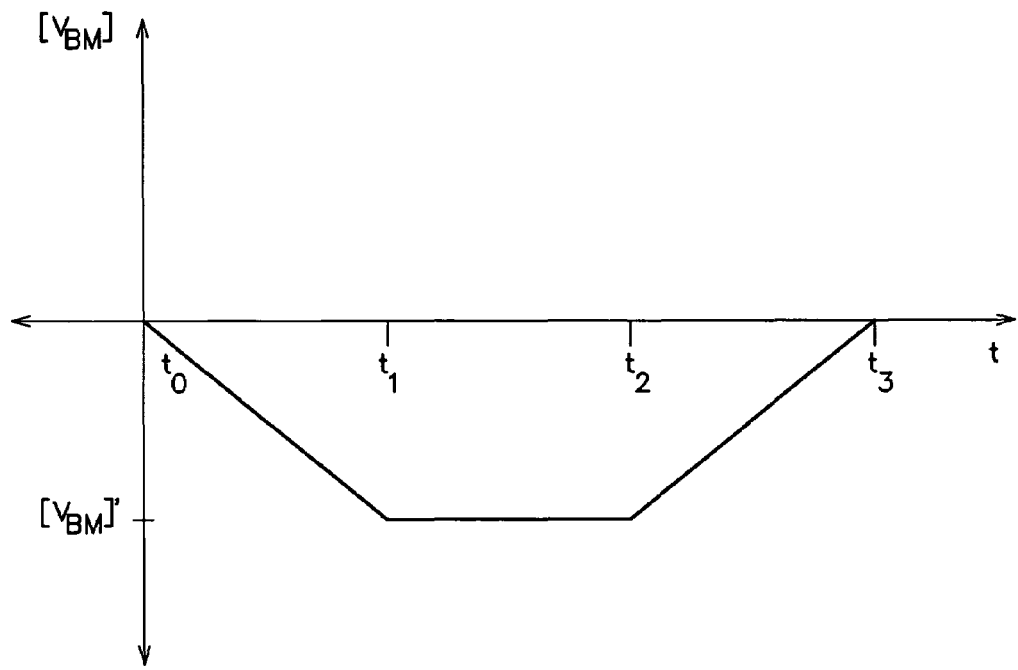
FIG. 11A includes a plot of the magnitude of the balancing mass velocity vector ($V_{I,BM}$) over the same time period as shown in FIG. 10A.
Figure 11B:
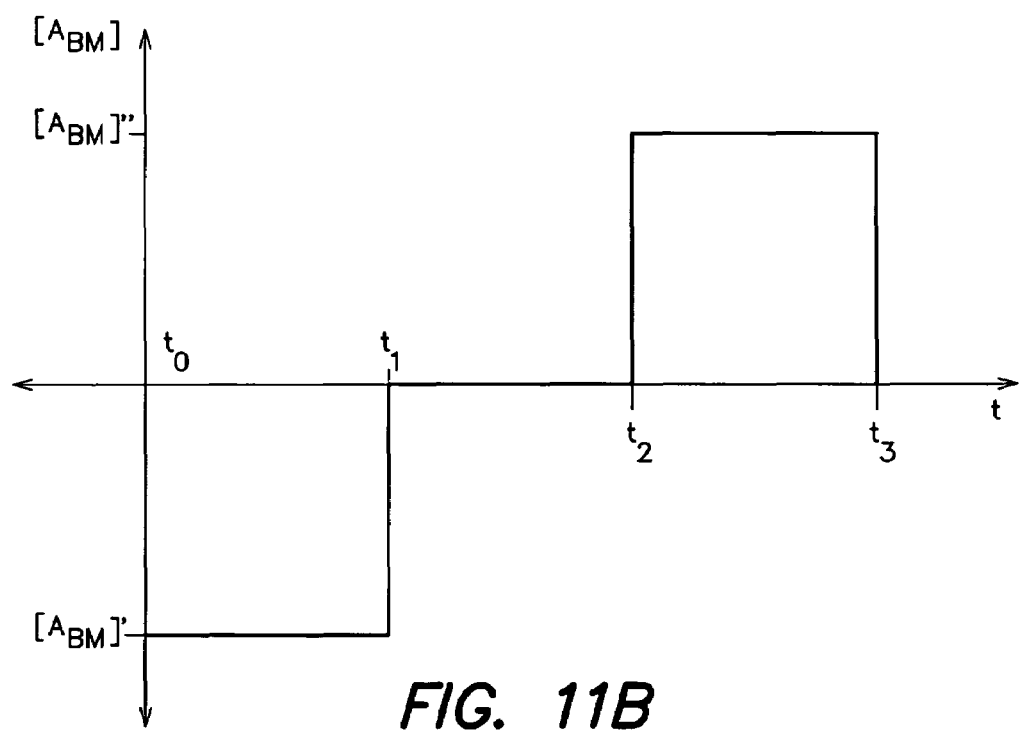
FIG. 11B includes a plot of the magnitude of the balancing mass acceleration vector ($A_{BM}$) over the same time period as shown in FIG. 10A.

FIGS. 9A–9E are top schematic views of the first guide 807a that illustrate sequential positions of the end effector 817a and the balancing mass 819a as they move along the first extrusion 807ac of the first actuator 807a. FIG. 10A includes a plot of the magnitude of the end effector velocity vector ($V_{EE}$) over time as the end effector 817a and the balancing mass 819 move along the first extrusion 807ac of the first actuator 807a. FIG. 10B includes a plot of the magnitude of the end effector acceleration vector ($A_{EE}$) over the same time period. FIG. 10C includes a plot of the magnitude of the end effector inertial load vector ($F_{I,EE}$) over the same time period. And FIG. 10D includes a plot of the magnitude of the velocity vector ($V_{WC}$) of the substrate carrier (i.e., the "target" substrate carrier 207 of FIG. 4A) to be removed from the moving high-speed conveyor 231, over the same time period. FIG. 11A includes a plot of the magnitude of the balancing mass velocity vector ($V_{BM}$) over the same time period. FIG. 11B includes a plot of the magnitude of the balancing mass acceleration vector ($A_{BM}$) over the same time period, and FIG. 11C includes a plot of the magnitude of the balancing mass inertial load vector ($F_{I,BM}$) over the same time period.

Figure 9A:
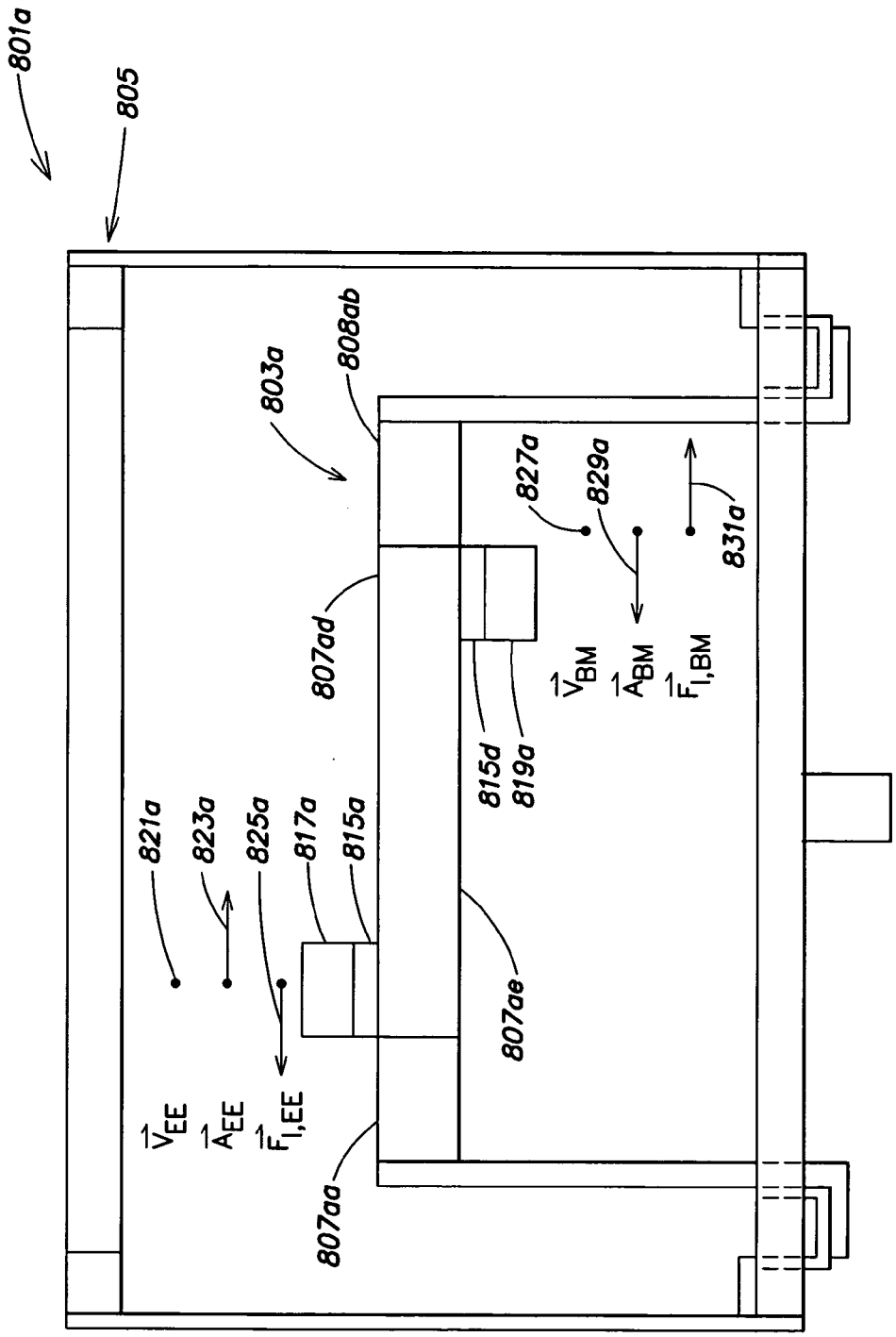
FIGS. 9A–9E are top schematic views of the first actuator that illustrate sequential positions of an end effector and a balancing mass during substrate carrier transfer between the end effector and an overhead conveyor.

Referring to FIG. 9A, the substrate carrier handler 803a of the high speed load stations 801a is shown in a top view, supported by the frame 805 of FIG. 8. Specifically, the end effector 817a is coupled to the first vertical side 807ad of the first guide 807a via the first carriage 815a for controlled horizontal movement from the first end 807aa to the second end 807ab of the first guide 807a along the first extrusion 807ac, and the balancing mass 819a is coupled to the second vertical side 807ae of the first guide 807a via the fourth carriage 815d for controlled horizontal movement from the second end 807ab to the first end 807aa of the first actuator 807a, also along the first extrusion 807ac.

Figure 9B:
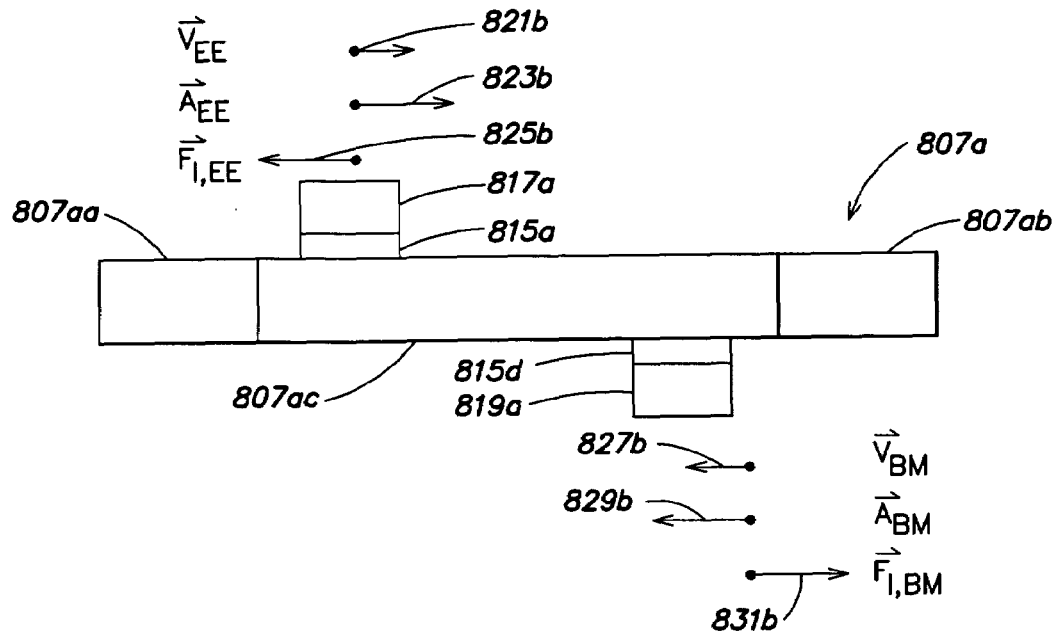
Figure 9C:
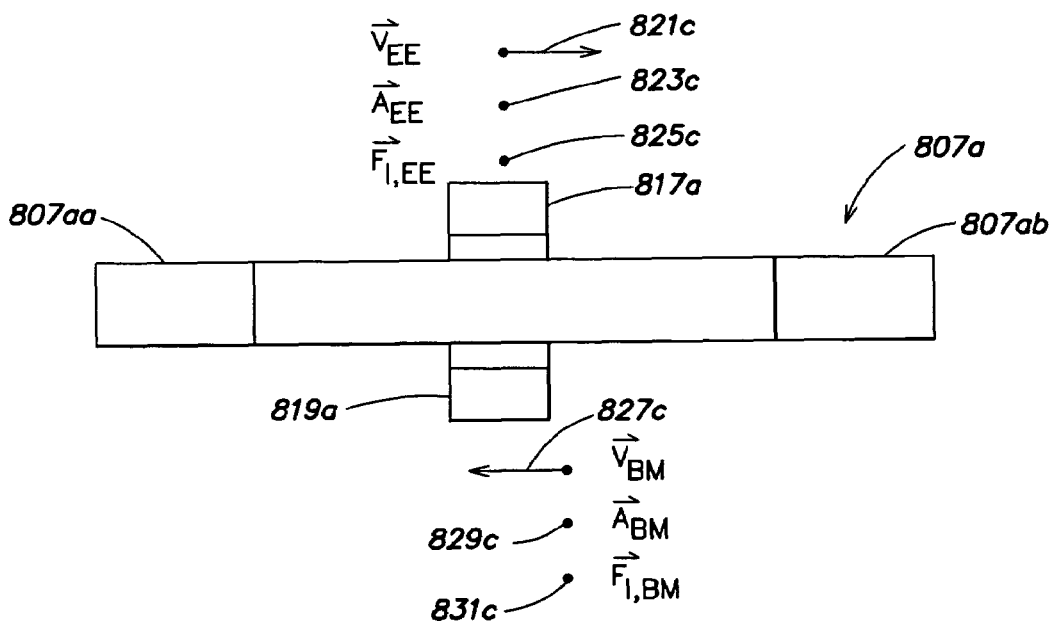
Figure 9D:
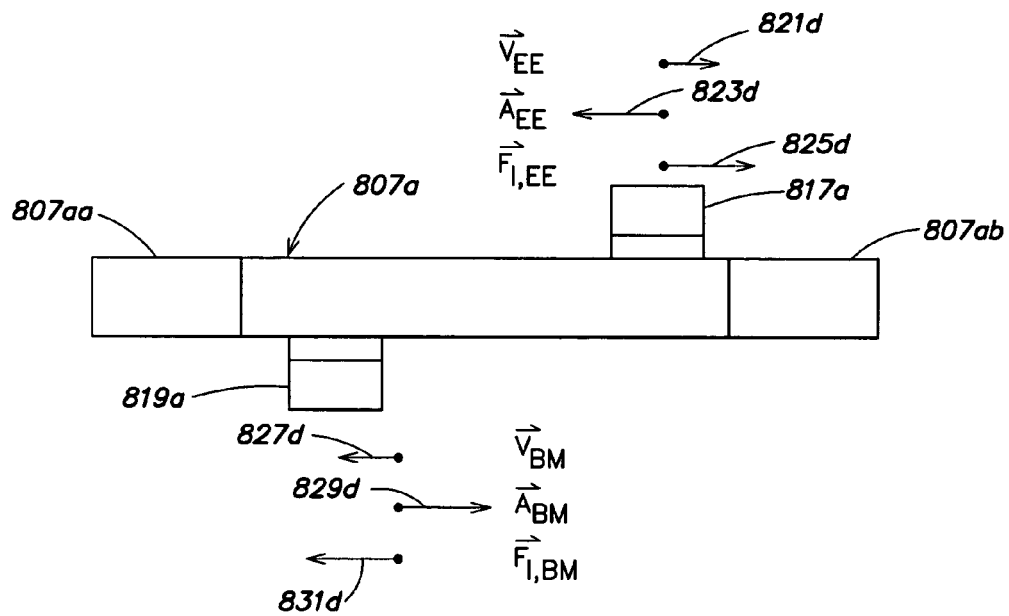
Figure 9E:
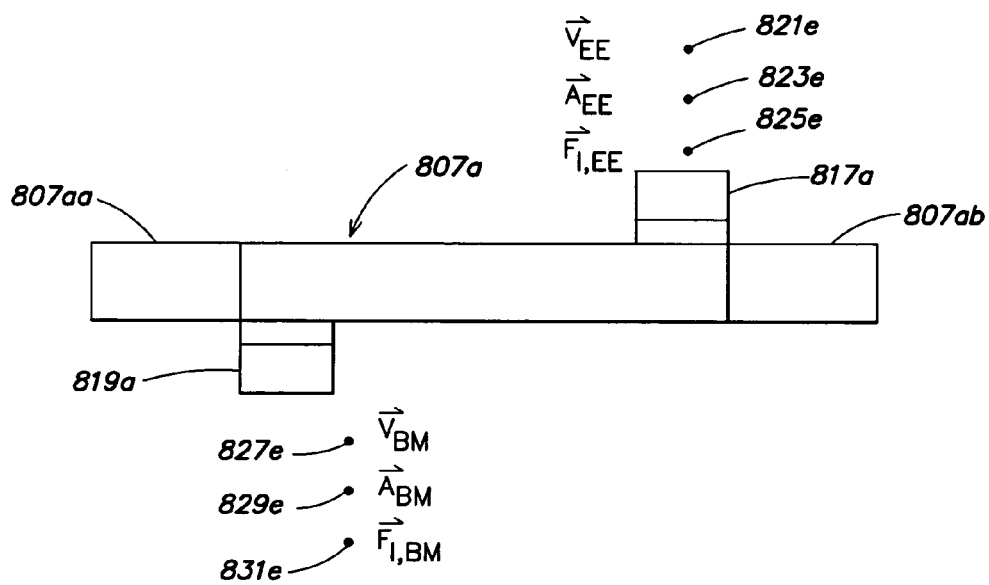

Referring to FIGS. 9A–E, 10A–10D, and 11A–11C, and considering a span of time during the removal of the substrate carrier 207 from the high-speed substrate carrier handler 231 that begins at time $t_0$ and extends through times $t_1$ and $t_2$ before reaching time $t_3$, FIG. 9A includes a view of the substrate carrier handler 803a at time $t_0$. FIG. 9B includes a view of the substrate carrier handler 803a at a point in time between $t_0$ and $t_1$. FIG. 9C is a view of the substrate carrier handler 803a at a point in time between $t_1$ and $t_2$. FIG. 9D is a view of the substrate carrier handler 803a at a point in time between $t_2$ and $t_3$. FIG. 9E is a view of a portion of the substrate carrier handler 803a at time $t_3$. The magnitude of the velocity vector (i.e., $V_{EE}$) of the end effector 817a, and the magnitude and direction of the acceleration vector (i.e., $A_{EE}$) and the inertial load vector (i.e., $F_{I,EE}$) of the end effector 817a, change as the end effector 817a moves in what is herein referred to as the positive direction of movement from the first end 807aa to the second end 807ab of the first actuator 807a. The velocity, acceleration, and inertial load vectors $V_{EE}$, $A_{EE}$, and $F_{I,EE}$ of the end effector 817a are represented by points and arrows respectively labeled with the reference numerals 821a–e, 823a–e and 825a–e. The magnitude of the velocity vector (i.e., $V_{BM}$) of the balancing mass 819a, and the magnitude and direction of the acceleration vector (i.e., $A_{EE}$) and the inertial load vector (i.e., $F_{I,BM}$) of the balancing mass 819a, change as the balancing mass 819a moves in what is herein deemed the negative direction of movement from the second end 807ab to the first end 807aa of the first actuator 807a. The velocity, acceleration, and inertial load vectors $V_{BM}$, $A_{BM}$ and $F_{I,BM}$ of the balancing mass are represented by points and arrows respectively labeled with the reference numerals 827a–e, 829a–e, and 831a–e.

In operation, as briefly described above, as the end effector 817a moves from the first end 807aa to the second end 807ab of the first actuator 807a, the inertial load $F_{I,EE}$ will arise from the end effector 817a whenever the end effector 817a is being subjected to positive or negative (i.e., non-zero) acceleration. The magnitude [$_{I,EE}$] of the inertial load $F_{I,EE}$ will equal the product of the mass of the end effector 817a and the magnitude [$A_{EE}$] of the acceleration vector $A_{EE}$ of the end effector 817a, and the direction of the inertial load vector $F_{I,EE}$ will always be directly opposite the direction of the acceleration vector $A_{EE}$. Similarly, as the balancing mass 819a moves from the second end 807ab to the first end 807aa of the first actuator 807a, the inertial load $F_{I,BM}$ will arise from the balancing mass 819a whenever it is being subjected to positive or negative (i.e., non-zero) acceleration. The magnitude [$F_{I,BM}$] of the inertial load $F_{I,BM}$ will equal the product of the mass of the balancing mass 819a and the magnitude [$A_{BM}$] of the acceleration vector $A_{BM}$ Of the balancing mass 819a. And the direction of the inertial load vector $F_{I,BM}$ will always be directly opposite the direction of the acceleration vector $A_{BM}$.

At time $t_0$, as shown in FIG. 9A, the first end effector velocity vector 821a (i.e., $V_{EE}$) of the end effector 817a has a magnitude [$V_{EE}$]' of zero as shown in FIG. 10A, but will soon positively increase due to the first end effector acceleration vector 823a (i.e., $A_{EE}$) having a positive magnitude of [$A_{EE}$]' as shown in FIG. 10B. Because the end effector 817a is being subjected to positive acceleration, an inertial load (i.e., $F_{I,EE}$) has arisen from the end effector 817a comprising the first end effector inertial load vector 825a, which has a negative magnitude of [$F_{I,EE}$]' as shown in FIG. 10C. At the same time $t_0$, the first balancing mass velocity vector 827a (i.e., $V_{BM}$) of the balancing mass 819a also has a magnitude of zero as shown in FIG. 11A, but will soon negatively increase due to the first balancing mass acceleration vector 829a (i.e., $A_{BM}$) having a negative magnitude of [$A_{BM}$]' as shown in FIG. 11B. Because the balancing mass 819a is being subjected to negative acceleration, an inertial load (i.e., $F_{I,BM}$) has arisen from the balancing mass 819a comprising the first balancing mass inertial load vector 831a, which at time $t_0$ has a positive magnitude of [$F_{I,BM}$]' as shown in FIG. 1C. Substrate carrier 207 (FIG. 4A) is being transported at time $t_0$ by substrate carrier conveyor 231 (FIG. 2) at a high speed, namely $[V_{WC}]'$ as shown in FIG. 10D.

In a preferred embodiment, the mass of the balancing mass 819a is substantially equal to the mass of the end effector 817a. When, as here, the masses of the balancing mass 819a and the end effector 817a are substantially equal, to cause an inertial load $F_{I,BM}$ to arise from the balancing mass 819a which is equal in magnitude to and opposite in direction to the inertial load $F_{I,EE}$ arising from the end effector 817a, one may accelerate the balancing mass 819a at a rate $[A_{BM}]$ that is equal to a rate $[A_{EE}]$ at which the end effector 817a is being accelerated, while at the same time orienting the acceleration vector $A_{BM}$ of the balancing mass 819a in the opposite horizontal direction to the acceleration vector $A_{EE}$ of the end effector 817a. If the end effector 817a and the balancing mass 819a are mounted close to each other in the same horizontal plane, and to opposite sides of the same horizontally-oriented first guide 807a, as they are in the preferred first embodiment of the present invention as illustrated in FIGS. 9A–9E, and are driven by the same belt drive (not shown) which is in turn driven by the same motor (first motor 809a, see FIG. 8), as they also are in the first embodiment of FIGS. 9A–9E, the acceleration vectors $A_{EE}$ and $A_{BM}$ will always remain equal and opposite. Equivalent masses for the end effector 817a and the balancing mass 819a will then ensure that the inertial load vectors $F_{I,EE}$ and $F_{I,BM}$ remain equal and opposite.

If, as here, the masses of the end effector 817a and the balancing mass 819a are equivalent, once the end effector 817a removes a substrate carrier (not shown) from the substrate carrier conveyor (not shown) a system will be created in which the combined mass of the end effector 817a and the substrate carrier exceeds that of the balancing mass 819a. As such, if the substrate-carrier-burdened end effector 817a and the non-burdened balancing mass 819a were subjected to equal and opposite accelerations, it is not the case that equal and opposite inertial loads will arise. Thus a net non-zero inertial load will be imposed on the first guide 807a and transmitted to the frame 805 via the second actuator 807b and the third actuator 807c, since the balancing mass 819a is coupled to the frame 805 via the first actuator 807a, the second actuator 807b and the third actuator 807c. However the inertial load which would otherwise be imposed upon the frame 805 due to the addition of the substrate carrier to the end effector 817a can be countered by proportionately increasing the acceleration of the balancing mass at the appropriate time so as to continue to match the overall inertial load of the substrate carrier/end effector system. This may be desirable, since it is preferable to reduce transmitted vibration (including both vibration transmitted from the substrate carrier handler 803a to the frame 805, and vibration transmitted from the frame 805 to the substrate processing tool adjacent to which the frame 805 is mounted) to as great an extent as possible. If countering the additional inertial load is necessary, separate driving apparatus may be utilized to accelerate the balancing mass and the end effector at different rates.

Referring to FIGS. 9A–9E, it is assumed that the mass of the end effector 817a and the balancing mass 819a in FIGS. 9A–9E are equivalent, and that the additional inertial load component contributed by the substrate carrier (not shown) that the end effector 817a is removing from the substrate carrier conveyor (not shown), is discounted. It therefore can be seen with reference to FIGS. 10A–10D, 11A–11C, and with consideration given to the fact that the end effector 817a and the balancing mass 819a are driven by a common belt drive (not shown) that is driven in turn by a single motor, i.e., the first motor 809a (see FIG. 8), that the magnitudes of the first through the fifth end effector acceleration vectors 823a–e are equivalent to the respective magnitudes of the first through the fifth balancing mass acceleration vectors 829a–e. As such, given the equivalent masses of the end effector 817a and the balancing mass 819a, the magnitudes of the first through the fifth end effector inertial load vectors 825a–e are equivalent to the respective magnitudes of the first through the fifth balancing mass inertial load vectors 831a–e.

Specifically in FIG. 9A, which corresponds to time $t_0$, the magnitude of the first end effector acceleration vector 823a has just increased from zero to $[A_{EE}]'$ as shown in FIG. 10B, which is equivalent to $[A_{BM}]$, the magnitude of the first balancing mass acceleration vector 829a, as shown in FIG. 11B, and the magnitude of the first end effector inertial load vector 825a has just increased from zero to $[F_{I,EE}]'$ as shown in FIG. 10C, which is equivalent to $[F_{I,BM}]$, the magnitude of the first balancing mass inertial load vector 831a, as shown in FIG. 1C.

In FIG. 9B, which corresponds to an instant in the interval between time $t_0$ and time $t_1$, the magnitude of the second end effector acceleration vector 823b remains that of the first end effector acceleration vector 823a and the magnitude of the second balancing mass acceleration vector 829b remains that of the first balancing mass acceleration vector 829a. As such, the magnitude of the second end effector inertial load vector 825b remains that of first end effector inertial load vector 825a, and the magnitude of the second balancing mass inertial load vector 831b remains that of the first balancing mass inertial load vector 831a. In other words the magnitude of the second balancing mass inertial load vector 831b and the magnitude of the second end effector inertial load vector 825b remain equivalent. It is also noted that as the end effector velocity vector $V_{EE}$ increases from the first end effector velocity vector 821a (FIG. 9A), which has a magnitude of zero (see also FIG. 10A), to the second end effector velocity vector 821b (FIG. 9B), which has a positive magnitude (see also FIG. 10A), it remains equivalent in magnitude with the balancing mass velocity vector $V_{BM}$, which has increased from the zero magnitude (see FIG. 11A) first balancing mass velocity vector 827a (FIG. 9A) to the second balancing mass velocity vector 827b, which has a negative magnitude (see also FIG. 11A). This results because the acceleration profiles of the end effector 817a and the balancing mass 819a, as shown in FIGS. 10A and 11A, are matched.

In FIG. 9C, which corresponds to an instant in the interval between time $t_2$ and time $t_3$, all of the acceleration and inertial load vectors 823c, 825c, 829c and 831c are at zero magnitude. This is because the positive acceleration of the end effector 817a that took place between time $t_0$ and $t_1$ has increased the magnitude of the end effector velocity vector to $[V_{EE}]$ (see FIG. 10A), which at time $t_1$ is and until time $t_2$ will be equivalent to the speed $[V_{WC}]'$ (FIG. 10D) of the substrate carrier 207 (FIG. 4A) as it is transported by the high-speed substrate carrier conveyor 231 (FIG. 2) before being removed therefrom. The speed $[V_{WC}]$ at which the substrate carrier 207 (FIG. 4A) is being transported by the conveyor 231 (FIG. 2) at time $t_1$ and briefly thereafter is, in most or all cases, equivalent to the speed of rotation of the conveyor 231 (FIG. 2) itself. This speed matching "zone" between time $t_1$ and time $t_2$ enables the end effector 817a to interact with the conveyor 231 (FIG. 2) in a well-controlled fashion such that the substrate carrier 207 (FIG. 4A) can be detached efficiently.

It should be noted that between time $t_1$ and time $t_2$, the end effector acceleration vector $A_{EE}$ may in actuality deviate slightly from zero magnitude for at least one brief span of time to slow the end effector 817*a*, now burdened with the substrate carrier 207 (FIG. 4A), so that an overhead transfer flange 402 (FIG. 4A) of the substrate carrier 207 (FIG. 4A) can be horizontally withdrawn from a corresponding substrate carrier support 401 (FIG. 4A) of the conveyor 231 (FIG. 2) along an in-line direction of travel of the conveyor 231 (FIG. 2). If it is desired to cause the substrate carrier 207 (FIG. 4A) to thereafter re-assume the speed of the conveyor 231 (FIG. 2), e.g., to ensure that the substrate carrier 207 (FIG. 4A) does not strike other substrate carriers or other parts of the conveyor 231 (FIG. 2) as the substrate carrier 207 is lifted and lowered away from the conveyor 231 (FIG. 2), a second brief period of non-zero acceleration, this time slightly positive in magnitude, may be required, all between time $t_1$ and time $t_2$. These minor deviations from zero acceleration may in most, circumstances not tend to produce an inertial load in the end effector 817*a* that is of a magnitude that risks the possibility of unacceptable vibration in the frame 805 in the absence of a balancing mass to cancel out the inertial load. Nevertheless because the balancing mass 819*a* will be subject to counterbalancing accelerations during this time period, at least a portion (masses of the end effector 817*a*/substrate carrier 207 system and of the balancing mass 819*a* no longer being substantially equal) of the inertial load $F_{I,EE}$ arising in the end effector 817*a* and caused by these minor adjustments in end effector acceleration will be canceled by the inertial load $F_{I,BM}$ arising in the balancing mass 819*a*. The balancing mass 819*a* is automatically accelerated in the opposite direction of the end effector 817*a* because both are coupled to the same belt drive (not shown). Otherwise the balancing mass 819*a* travels at a speed $[V_{BM}]$ (see FIG. 11A) that is equal to that of the end effector 817*a* during this period.

Figure 11C:
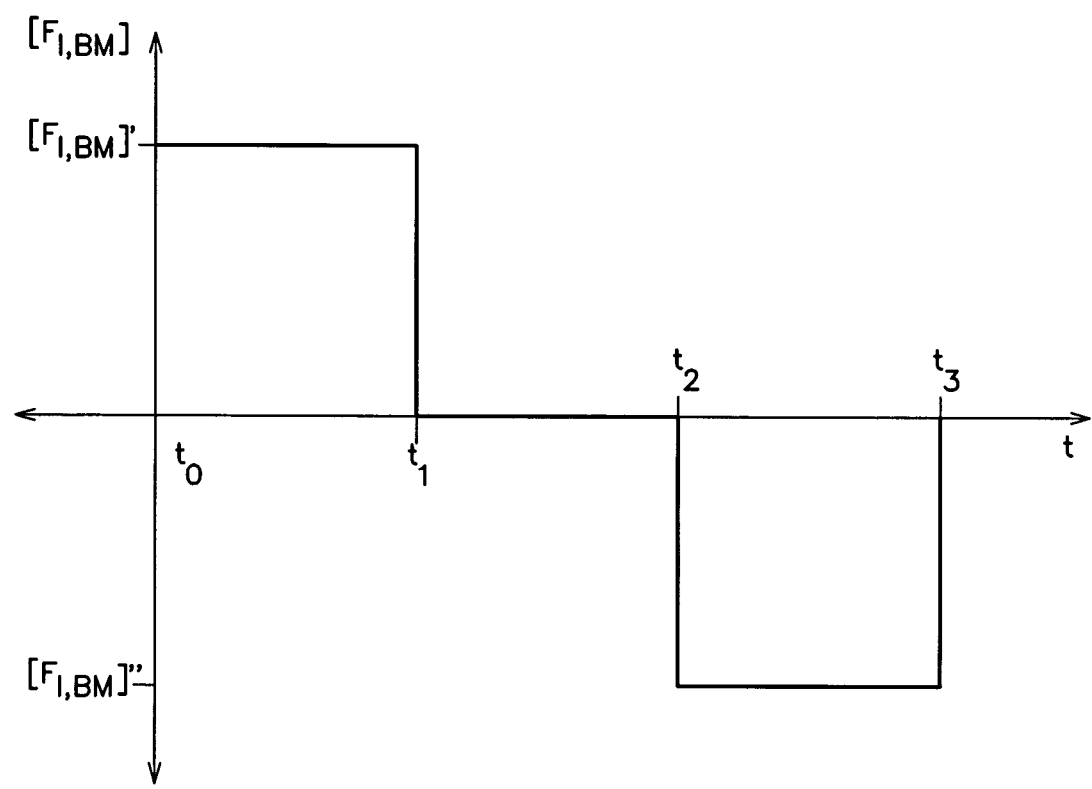
FIG. 11C includes a plot of the magnitude of the balancing mass inertial load vector ($F_{I,BM}$) over the same time period as shown in FIG. 10A.

In FIG. 9D, which corresponds to an instant in the interval between time $t_2$ and time $t_3$, the magnitude of the fourth end effector acceleration vector 823*d* is $[A_{EE}]''$ (as shown in FIG. 10B), which is equivalent to $[A_{BM}]''$, the magnitude of the fourth balancing mass acceleration vector 829*d* (as shown in FIG. 11B), and the magnitude of the fourth end effector inertial load vector 825*d* is $[F_{I,EE}]''$ (as shown in FIG. 10C), which is equivalent to $[F_{I,BM}]''$, the magnitude of the fourth balancing mass inertial load vector 831*d* (as shown in FIG. 11C). During this period, in which the assumption of equal masses for the end effector 817*a* and the balancing mass 819*a* still applies, the speed $[V_{EE}]$ of the end effector 817*a* is being reduced (see FIG. 10A) so that the end effector 817*a* will eventually come to rest in preparation for delivery of the substrate carrier 207 (FIG. 4A) to the processing tool (FIG. 1).

In FIG. 9E, the substrate carrier handler 803*a* is shown at the instant $t_3$ at which the end effector velocity vector $V_{EE}$ has reached zero magnitude (see FIG. 10A) as shown by the fifth end effector velocity vector 821*e*, and the end effector acceleration and inertial load vectors $A_{EE}$, $F_{I,EE}$ have dropped from the $[A_{EE}]''$ and $[F_{I,EE}]''$ levels to zero (see FIGS. 10B and 10C, respectively), as shown by the fifth end effector acceleration vector 823*e* and the fifth end effector inertial load vector 825*e*. As well, the balancing mass velocity vector $V_{BM}$ has reached zero magnitude (see FIG. 11A) as shown by the fifth balancing mass velocity vector 827*e*, and the balancing mass acceleration and inertial load vectors $A_{BM}$, $F_{I,BM}$ have dropped from the $[A_{BM}]''$ and $[F_{I,BM}]''$ levels to zero (see FIGS. 11B and 11C, respectively) as shown by the fifth balancing mass acceleration vector 829*e* and the fifth balancing mass inertial load vector 831*e*. As such, throughout the transit of the end effector 817*a* from the first end 807*aa* to the second end 807*ab* of the first guide 807*a*, the inertial load $F_{I,EE}$ arising from the end effector 817*a* has been canceled by a matching and balancing inertial load $F_{I,BM}$ arising from the balancing mass 819*a*.

Figure 12:
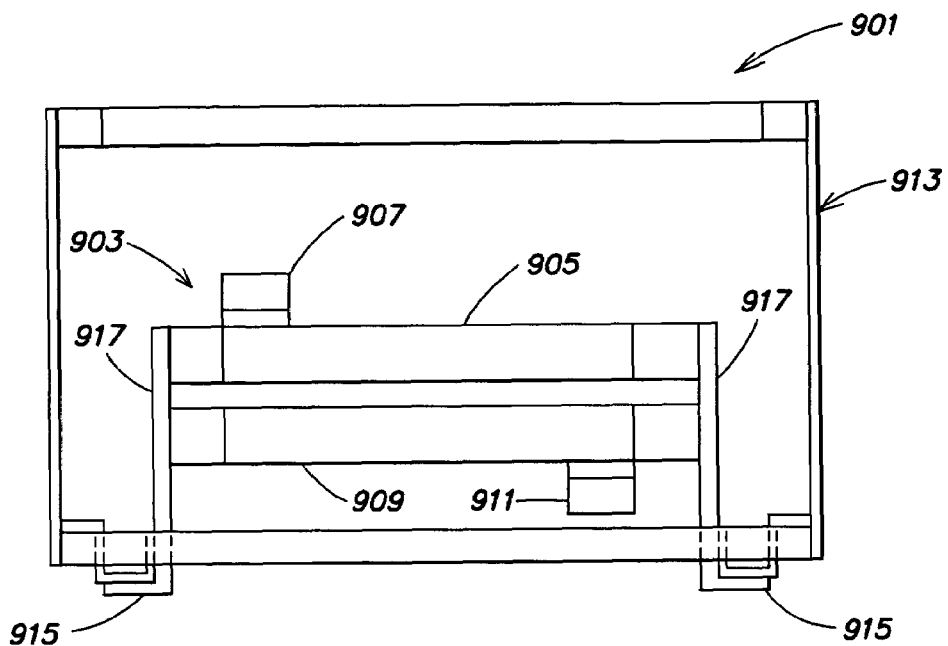
FIG. 12 is a top schematic view of a high-speed load station equipped with a high-speed substrate carrier handler that is dynamically balanced.

FIG. 12 is a top schematic view of a high-speed load station 901 equipped with a high-speed substrate carrier handler 903 that is dynamically balanced. The high-speed load station 901 is similar to that of FIG. 8 except in that the substrate carrier handler 903 of the high-speed load station 901 comprises a first horizontal guide 905 for moving the end effector 907 horizontally and a second horizontal guide 909 for moving the balancing mass 911 horizontally, whereas the substrate carrier handler 803*a* of the high speed load stations 801*a* has only one guide 807*a* for moving both the end effector 817*a* and the balancing mass 819*a* horizontally. The first horizontal guide 905 and the second horizontal guide 909 are commonly mounted to the frame 913 of the high-speed load station 901 via mounting brackets 915 and vertical guides 917. This embodiment, although not being adapted to apply a balancing load directly to the first horizontal guide 905 of the end effector 907, still is adapted to apply a balancing load to the high-speed substrate carrier handler 903, and thus deters the frame 913 from experiencing unbalanced inertial loading therefrom, and may reduce the vibration the frame experiences.

Figure 13:
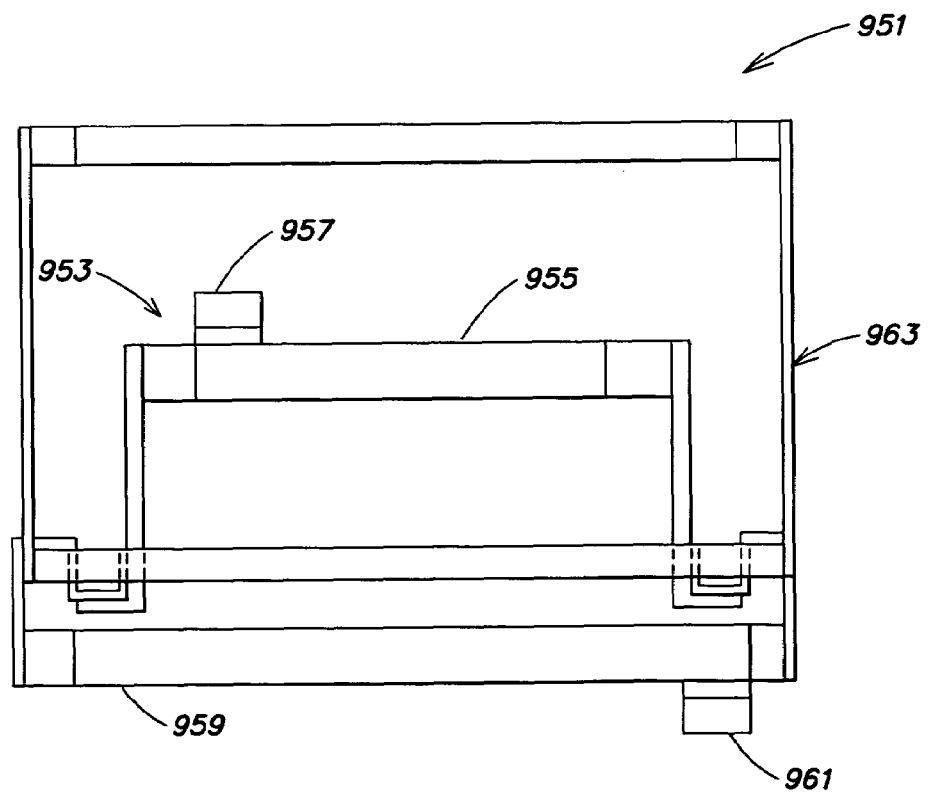
FIG. 13 is a top schematic view of a high-speed load station that is dynamically balanced.

FIG. 13 is a top schematic view of a high-speed load station 951 that is dynamically balanced. The high-speed load station 951 is similar to the high-speed load station 901 of FIG. 12 except that the substrate carrier handler 953 of the high-speed load station 951 has only one horizontal guide 955 that moves the end effector 957 horizontally, and the horizontal guide 959 that moves the balancing mass 961 horizontally is attached directly to the frame 963 of the high-speed load station 951. This embodiment, although not being adapted to apply a balancing load directly to the substrate carrier handler 953 as does the high-speed load station 901 of FIG. 12, still is adapted to apply a balancing load to the frame 963 of the high-speed load station 951, and thus deters transmission of unbalanced loading from the high-speed load station 951 to a factory interface (FIG. 1), as well as reducing the vibration associated with such unbalanced loading.

Figure 14:
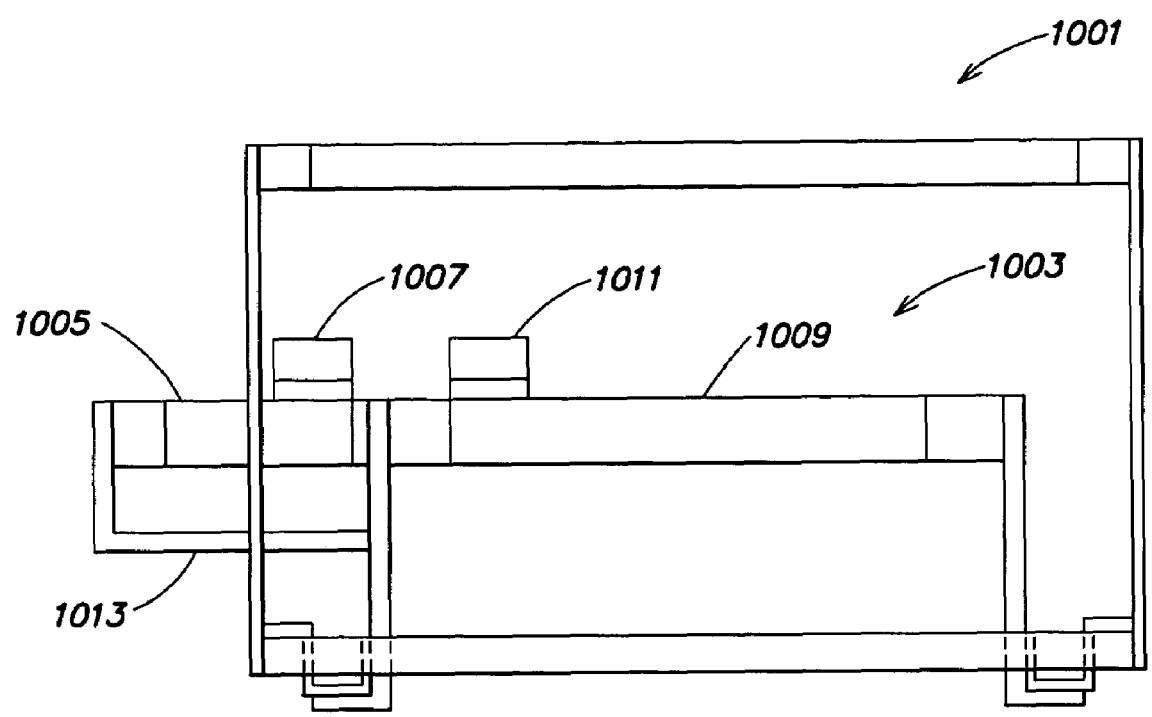
FIG. 14 is a top schematic view of a high-speed load stations equipped with a high-speed substrate carrier handler that is dynamically balanced, as well as balanced as to torque.

FIG. 14 is a top schematic view of a high-speed load stations 1001 equipped with a high-speed substrate carrier handler 1003 that is dynamically balanced, as well as balanced as to torque. The high-speed load stations 1001 is similar to the high-speed load station 901 of FIG. 12 except that the horizontal guide 1005 of the high-speed substrate carrier handler 1003 that is dedicated to the horizontal movement of the balancing mass 1007 is in-line with the horizontal guide 1009 of the high-speed substrate carrier handler 1003 that is dedicated to the horizontal movement of the end effector 1011. An extended bracket 1013 holds the horizontal guide 1005 in a cantilevered fashion end-to-end adjacent to the horizontal guide 1009, eliminating a torque which otherwise would be unbalanced. The length of the horizontal extrusion 1005 can be shorter as long as the mass of the balancing mass 1007 is increased to provide adequate load balancing.

The foregoing description discloses only an exemplary embodiment of the invention; modifications of the above disclosed apparatus and methods which fall within the scope of the invention will be readily apparent to those of ordinary skill in the art. For example, instead of employing two vertical guides in the substrate carrier handler illustrated above, only one vertical guide may be employed. Also, the substrate carrier handler may be arranged with a vertical guide that is coupled for horizontal movement along a horizontal guide instead of the horizontal guide being coupled for vertical movement along vertical guides.

When the substrate carrier handler includes a vertical guide mounted for movement along a horizontal guide, the raising of the end effector to disengage a substrate carrier from a conveyor, or the lowering of the end effector to hand off the substrate carrier to the conveyor, may be accomplished by raising or lowering the end effector along the vertical guide (e.g., rather than by raising the horizontal guide relative to one or more vertical guides). An actuator (such as a belt drive or lead screw not shown) may be provided on the support 223 of the substrate carrier handler 215 to raise the end effector 225 relative to the horizontal guide 221 to disengage a substrate carrier from the conveyor 231, or to lower the end effector 225 toward the horizontal guide 221 to hand off the substrate carrier to the conveyor 231 (in addition to or instead of raising/lowering the horizontal guide 221 along a vertical guide or guides).

The present invention may be employed to unload substrate carriers from, and load substrate carriers onto, a conveyor which transports substrate carriers in a vertical orientation. In such a case, the end effector 225 may include a reorientation mechanism for reorienting the substrate carrier between vertical and horizontal orientations.

The present invention is illustrated with respect to single substrate carriers, but the present invention may be employed with substrate carriers that hold more than one substrate, or with a system that transports bare substrates (i.e., substrates that are transferred without a corresponding carrier.

The particular embodiment of a substrate loading station illustrated herein includes docking stations arranged in a plurality of vertical stacks. However, the above-illustrated substrate loading station may include only one vertical stack of docking stations, or only one docking station. The substrate loading station may include one or more storage shelves and/or no storage shelves.

In the exemplary substrate loading station illustrated herein, the docking stations are shown to include docking grippers that suspend a substrate carrier to move it between docked and undocked positions. Alternatively the docking stations may include docking sleds or platforms which support a substrate carrier from below, via the substrate carrier's bottom or sides, etc., while moving the substrate carrier between docked and undocked positions.

Preferably, the invention is employed in a substrate loading station that comprises a frame to which the vertical and horizontal guides are coupled. In this manner, the preferred substrate loading station is modular and may be quickly installed and calibrated. In the event the substrate loading station includes one or more storage shelves (e.g., storage shelf 239 in FIG. 2), each storage shelf also may be mounted on the frame. By mounting both the substrate carrier handler and the storage shelf or shelves to the frame, the substrate carrier handler and storage shelves have a predetermined position relative to each other. This further facilitates installation and calibration, and is another advantage of employing a modular substrate loading station. Similarly, other mechanisms such as dedicated mechanisms for loading and/or unloading substrate carriers from an overhead factory transport system may be advantageously mounted to the frame as described for example, in previously incorporated U.S. patent application Ser. No. 10/650,310, filed Aug. 28, 2003 and titled "System For Transporting Substrate Carriers".

In one aspect, the frame may be mounted to predetermined mounting locations (e.g., predrilled bolt holes, etc.) on the clean room wall, or on the front wall of a chamber (e.g., a factory interface chamber). Preferably, the wall also has predetermined mounting locations to which the docking grippers or docking platforms are mounted. Additionally, the wall may have predetermined mounting locations to which a substrate carrier opening mechanism may be mounted. When the frame, the docking mechanisms, and the substrate carrier opening mechanism are each mounted to predetermined locations on the same surface, the relative positions of each are predetermined, and installation and calibration of the substrate loading station is facilitated.

Although the conveyor described herein has been illustrated as being positioned above the substrate loading station 201, alternatively the conveyor may be at or below the height of the substrate loading station or at another location positioned adjacent the substrate loading station.

The substrate loading station illustrated herein may be utilized to provide substrates to a processing tool, a metrology location, or any other location to which a substrate may be transported. Further, rather than being adapted to load substrates to a fabrication tool, the inventive apparatus with dynamically balanced substrate handler may comprise a storage location with no docking stations, or may comprise merely a frame having a dynamically balanced substrate handler mounted thereto, and no storage or docking/loading stations associated therewith.

From the foregoing description, it will be understood that the inventive substrate loading station may be installed in association with a factory interface (FI) having an FI robot that transfers a substrate from a docking station of the substrate loading station to a load lock chamber of a processing tool (such as in the system of FIG. 1). Alternatively, the factory interface may be eliminated, and the load lock chamber may include a substrate handler that transfers a substrate directly from the docking station of the substrate loading station. As another alternative, the processing tool may operate at atmospheric pressure rather than under vacuum, so that the load lock chamber may be eliminated.

While the present invention has been described primarily with reference to wafers, it will be understood that the invention also may be employed with other substrates such as a silicon substrate, a glass plate, a mask, a reticule, etc., whether patterned or unpatterned; and/or with apparatus for transporting and/or processing such substrates. In at least embodiment, each vertical guide may be driven by its own motor, rather than by a common motor with a gearbox (e.g., and the motion of each vertical guide synchronized). A counterbalance can be used on a vertical axis to minimize inertial input to the floor (e.g., using a mass equal to the weight of the horizontal axis, such as the horizontal guide and its various components).

Accordingly, while the present invention has been disclosed in connection with exemplary embodiments thereof, it should be understood that other embodiments may fall within the spirit and scope of the invention as defined by the following claims.

The invention claimed is:

1. An apparatus comprising:
   a frame;
   a substrate carrier handler coupled to the frame, the substrate carrier handler comprising an end effector adapted to move a substrate carrier to or from a conveyor adapted to transport substrate carriers, the substrate carrier handler being further adapted to accelerate while moving the substrate carrier to or from the conveyor, and by said acceleration to impose a first inertial load on the frame; and a moveable balancing mass coupled to the frame and adapted to accelerate when the end effector accelerates so as to substantially cancel the first inertial load, thereby reducing a vibration that would occur absent the balancing mass.

2. The apparatus of claim 1 wherein the balancing mass is coupled to the frame via the substrate carrier handler.

3. The apparatus of claim 2 further comprising a single motor coupled to both the balancing mass and the end effector so as to simultaneously drive the balancing mass and the end effector in opposite directions along a substantially equal distance.

4. The apparatus of claim 3, wherein the balancing mass is substantially equivalent in mass to the end effector.

5. The apparatus of claim 1 further comprising an additional support member coupled to the frame wherein the moveable balancing mass is coupled to the frame via the additional support member.

6. The apparatus of claim 1, wherein by said acceleration of the balancing mass, the balancing mass is adapted to impose a second inertial load on the frame so as to substantially cancel the first inertial load.

7. The apparatus of claim 6, wherein the second inertial load that the balancing mass is adapted to impose on the frame is substantially equivalent in magnitude to and substantially opposite in direction to the first inertial load.

8. The apparatus of claim 1, wherein the balancing mass is substantially equivalent in mass to the end effector.

9. The apparatus of claim 8, wherein the end effector is adapted to impose the first inertial load on the frame by accelerating horizontally along a first substantially linear path.

10. The apparatus of claim 9, wherein the balancing mass is adapted to impose the second inertial load on the frame by accelerating horizontally along a second substantially linear path that is parallel to the first substantially linear path.

11. The apparatus of claim 10, wherein the first substantially linear path and the second substantially linear path define a substantially horizontal plane.

12. The apparatus of claim 10, wherein the first substantially linear path and the second substantially linear path define a substantially vertical plane.

13. The apparatus of claim 10, wherein the first substantially linear path and the second substantially linear path are substantially collinear.

14. The apparatus of claim 10, further comprising a belt coupled to the end effector and to the balancing mass, and adapted to simultaneously accelerate the end effector along the first substantially linear path and the balancing mass along the second substantially linear path.

15. The apparatus of claim 14, further comprising a motor coupled to and adapted to rotate the belt.

16. The apparatus of claim 1, further comprising a controller coupled to the substrate carrier handler and operative to control the substrate carrier handler such that the end effector of the substrate carrier handler disengages a substrate carrier from the conveyor while the substrate carrier is moving along the conveyor.

17. The apparatus of claim 16, wherein the controller is operative to control the substrate carrier handler such that during at least a portion of the disengagement of the substrate carrier from the substrate carrier conveyor the end effector of the substrate carrier handler substantially matches a motion of the substrate carrier as it is moving along the conveyor.

18. The apparatus of claim 17, wherein the controller is operative to control the substrate carrier handler such that during the at least a portion of the disengagement of the substrate carrier from the substrate carrier conveyor the end effector of the substrate carrier handler substantially matches a velocity of the substrate carrier as it is moving along the conveyor.

19. The apparatus of claim 18, wherein the controller is operative to control the substrate carrier handler such that during the at least a portion of the disengagement of the substrate carrier from the substrate carrier conveyor the end effector of the substrate carrier handler substantially matches a speed and position of the substrate carrier in a horizontal direction.

20. The apparatus of claim 16, further comprising at least one sensor coupled to the controller and adapted to indicate a position of a component of the substrate carrier conveyor.

21. The apparatus of claim 16, wherein the controller is further operative to control the substrate carrier handler such that the end effector of the substrate carrier handler transfers the substrate carrier to the substrate carrier conveyor while the substrate carrier conveyor is in motion.

22. The apparatus of claim 16, wherein the controller is further operative to control the substrate carrier handler such that the end effector of the substrate carrier handler disengages the substrate carrier from a substrate carrier conveyor while the substrate carrier is moving along the conveyor by:
   determining a speed of the substrate carrier conveyor;
   determining a first motion profile for the end effector based on the speed of the substrate carrier conveyor; and
   employing the first motion profile to control motion of the end effector during at least a portion of the disengagement of the substrate carrier from the substrate carrier conveyor.

23. The apparatus of claim 1, wherein the end effector of the substrate carrier handler includes a horizontally oriented platform having a plurality of kinematic features.

24. The apparatus of claim 1, wherein the substrate carrier handler includes a vertical guide and a horizontal guide coupled to the vertical guide.

25. The apparatus of claim 24, wherein:
   the substrate carrier handler includes a pair of vertical guides;
   the horizontal guide is mounted for vertical movement along the vertical guides; and
   the end effector is mounted for horizontal movement along the horizontal guide.

26. The apparatus of claim 1, wherein the substrate carrier handler is adapted to move the end effector to at least an elevation at which the substrate carrier conveyor transports substrate carriers.

27. The apparatus of claim 1, wherein the substrate carrier handler is further adapted to place the substrate carrier on a loading station from which substrates may be extracted and transported to a processing tool.

28. The apparatus of claim 1, further comprising one or more storage shelves, wherein the substrate carrier handler is further adapted to move a substrate carrier to and from the one or more storage shelves.

29. The apparatus of claim 27, further comprising one or more storage shelves, wherein the substrate carrier handler is further adapted to move a substrate carrier to and from the one or more storage shelves.

30. A substrate transport system comprising:
a conveyor adapted to transport a substrate carrier in a substantially horizontal direction; and
an apparatus adjacent the conveyor comprising:
a frame;
a substrate carrier handler coupled to the frame, the substrate carrier handler comprising an end effector adapted to move a substrate carrier to or from a conveyor adapted to transport substrate carriers, the substrate carrier handler being adapted to accelerate while moving the substrate carrier to or from the conveyor, and by said acceleration to impose a first inertial load on the frame; and
a moveable balancing mass coupled to the frame and adapted to accelerate when the end effector accelerates so as to substantially cancel the first inertial load, thereby reducing a vibration that would occur absent the balancing mass.

31. The substrate transport system of claim 30, wherein the substrate carrier handler is adapted to unload the substrate carrier from the conveyor while the conveyor is moving.

32. The apparatus of claim 30, wherein the conveyor is positioned above the substrate carrier handler.

33. The substrate transport system of claim 32, wherein the substrate carrier handler is adapted to load a substrate carrier onto the conveyor while the conveyor is moving.

34. The substrate transport system of claim 32, the substrate carrier handler further comprising an end effector moving mechanism adapted to raise the end effector while substantially matching a velocity of the end effector to a velocity at which the substrate carrier is transported by the conveyor.

35. The substrate transport system of claim 30, wherein the substrate carrier handler is further adapted to place the substrate carrier on a loading station from which substrates may be extracted and transported to a processing tool.

36. The substrate transport system of claim 30, wherein the apparatus adjacent the conveyor further comprises one or more storage shelves, wherein the substrate carrier handler is further adapted to move a substrate carrier to and from the one or more storage shelves.

37. The substrate transport system of claim 35, wherein the apparatus adjacent the conveyor further comprises one or more storage shelves, wherein the substrate carrier handler is further adapted to move a substrate carrier to and from the one or more storage shelves.

38. A substrate carrier handler, comprising:
a horizontal guide;
an end effector mounted for horizontal movement along the horizontal guide, adapted to accelerate along the horizontal guide while moving a substrate carrier, and by said acceleration to impose a first inertial load on the horizontal guide; and
a moveable balancing mass coupled to the horizontal guide and adapted to accelerate when the end effector accelerates so as to substantially cancel the first inertial load, thereby reducing a vibration that would occur absent the balancing mass.

39. The substrate carrier handler of claim 38, wherein by said acceleration of the balancing mass, the balancing mass is adapted to impose a second inertial load on the horizontal guide so as to substantially cancel the first inertial load.

40. The substrate carrier handler of claim 39, wherein the balancing mass is substantially equivalent in mass to the end effector.

41. The substrate carrier handler of claim 38, further comprising a vertical guide, wherein the horizontal guide is coupled to the vertical guide.

42. The substrate carrier handler of claim 38, further comprising a pair of vertical guides, wherein the horizontal guide is mounted for vertical movement along the vertical guides.

43. A method comprising:
accelerating an end effector of a substrate carrier handler in a first direction along a frame, thereby imposing a first inertial load on the frame; and
accelerating a dummy mass in a second direction, opposite to the first direction, thereby imposing a second inertial load on the frame;
wherein the acceleration and weight of the dummy mass are such that the first and second inertial loads substantially cancel each other.

* * * * *